(12) United States Patent
Choo

(10) Patent No.: US 10,991,432 B2
(45) Date of Patent: Apr. 27, 2021

(54) STORAGE DEVICE AND METHOD OF OPERATING THE SAME

(71) Applicant: SK hynix Inc., Icheon-si (KR)

(72) Inventor: Heon Jin Choo, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/594,760

(22) Filed: Oct. 7, 2019

(65) Prior Publication Data
US 2020/0350022 A1 Nov. 5, 2020

(30) Foreign Application Priority Data
May 3, 2019 (KR) .......................... 10-2019-0052502

(51) Int. Cl.
*G11C 16/14* (2006.01)
*G11C 16/08* (2006.01)
*G11C 16/24* (2006.01)
*G11C 16/26* (2006.01)
*G11C 16/34* (2006.01)

(52) U.S. Cl.
CPC .............. *G11C 16/14* (2013.01); *G11C 16/08* (2013.01); *G11C 16/24* (2013.01); *G11C 16/26* (2013.01); *G11C 16/34* (2013.01)

(58) Field of Classification Search
CPC ......... G11C 16/14; G11C 16/34; G11C 16/26; G11C 16/24; G11C 16/08
See application file for complete search history.

(56) References Cited

U.S. PATENT DOCUMENTS 8,406,049 B2 * 3/2013 Nawata ................ G11C 11/5628
365/185.02
8,503,230 B2 * 8/2013 Yoo ..................... G11C 16/3454
365/185.03

(Continued)

FOREIGN PATENT DOCUMENTS

KR         100673026 B1    1/2007
KR      1020150063850 A    6/2015

OTHER PUBLICATIONS

Salvatore Maria Amoroso et al., "Semi-Analytical Model for the Transient Operation of Gate-All-Around Charge-Trap Memories", Sep. 2011, pp. 3116-3123, vol. 58, No. 9, IEEE Transactions on Electron Devices.

(Continued)

*Primary Examiner* — Tri M Hoang
(74) *Attorney, Agent, or Firm* — William Park & Associates Ltd.

(57) ABSTRACT

Provided herein is a method of operating a memory device configured to perform a program operation on a first memory cell coupled to a selected word line. The method includes determining, after the program operation on the first memory cell has been performed, whether a threshold voltage of a second memory cell coupled to a same bit line to which the first memory cell is coupled and coupled to a word line adjacent to the selected word line corresponds to an erased status. The method also includes applying to the first memory cell, when the threshold voltage of the second memory cell corresponds to the erased status, an additional program voltage higher by a preset voltage than a program voltage last applied during the program operation.

17 Claims, 18 Drawing Sheets

(56) References Cited

U.S. PATENT DOCUMENTS

| | | | | |
|---|---|---|---|---|
| 8,607,120 B2* | 12/2013 | Song | ............... | H03M 13/2906 |
| | | | | 714/763 |
| 8,638,607 B2* | 1/2014 | Sarpatwari | ............. | G11C 16/10 |
| | | | | 365/185.17 |
| 8,644,066 B2* | 2/2014 | Park | ................... | G11C 11/5628 |
| | | | | 365/185.03 |
| 9,058,878 B2* | 6/2015 | Aritome | ............. | G11C 16/0483 |
| 9,111,619 B2* | 8/2015 | Lee | ................... | H01L 27/1157 |
| 9,224,485 B2* | 12/2015 | Lee | ...................... | G11C 16/14 |
| 9,342,447 B2* | 5/2016 | Kim | ................... | G06F 12/0246 |

OTHER PUBLICATIONS

Xinkai Li et al., "Investigation of Charge Loss Mechanisms in 3D Tanos Cylindrical Junction-Less Charge Trapping Memory", IEEE, 2014, Beijing, China.

* cited by examiner

WHEN ADJACENT CELL HAS PROGRAMMED STATUS

WHEN ADJACENT CELL HAS ERASED STATUS

AFTER ADDITIONAL PROGRAM OPERATION IS PERFORMED WHEN ADJACENT CELL HAS ERASED STATUS

STORAGE DEVICE AND METHOD OF OPERATING THE SAME

CROSS-REFERENCE TO RELATED APPLICATION

The present application claims priority under 35 U.S.C. § 119(a) to Korean patent application number 10-2019-0052502, filed on May 3, 2019, the entire disclosure of which is incorporated herein by reference in its entirety.

BACKGROUND

1. Technical Field

Various embodiments of the present disclosure generally relate to an electronic device, and more particularly, to a storage device and a method of operating the storage device.

2. Related Art

Generally, a storage device stores data under the control of a host device, such as a computer or a smartphone. The storage device may include a memory device configured to store data and a memory controller configured to control the memory device. Memory devices are broadly characterized as volatile memory devices or nonvolatile memory devices.

A volatile memory device stores data only when supplied with power, and the stored data is lost when power is turned interrupted. Examples of a volatile memory device include a static random access memory (SRAM) and a dynamic random access memory (DRAM).

A nonvolatile memory device retains stored data even in the absence of power. Examples of a nonvolatile memory device include a read-only memory (ROM), a programmable ROM (PROM), an electrically programmable ROM (EPROM), an electrically erasable programmable ROM (EEPROM), and a flash memory.

SUMMARY

Various embodiments of the present disclosure are directed to a storage device having improved reliability and a method of operating the storage device.

An embodiment of the present disclosure may provide for a method of operating a memory device configured to perform a program operation on a first memory cell coupled to a selected word line. The method includes determining, after the program operation on the first memory cell has been performed, whether a threshold voltage of a second memory cell coupled to a same bit line to which the first memory cell is coupled and coupled to a word line adjacent to the selected word line corresponds to an erased status. The method also includes applying to the first memory cell, when the threshold voltage of the second memory cell corresponds to the erased status, an additional program voltage higher by a preset voltage than a program voltage last applied during the program operation.

An embodiment of the present disclosure may provide for a memory device including a memory cell array including a first memory cell coupled to a selected word line and a peripheral circuit configured to perform a program operation on the first memory cell. The memory device also includes control logic configured to control the peripheral circuit, after the program operation has been performed, if a threshold voltage of a second memory cell coupled to a same bit line to which the first memory cell is coupled and coupled to a word line adjacent to the selected word line corresponds to an erased status, to apply an additional program voltage higher by a preset voltage than a program voltage last applied during the program operation to the first memory cell.

An embodiment of the present disclosure may provide for a memory controller configured to control a memory device. The memory controller includes a normal program operation controller included in the memory device and configured to provide a normal program command for performing a normal program operation on a first memory cell coupled to a selected word line, and configured to obtain, when the normal program operation is completed, normal program complete information comprising information about the normal program operation. The memory controller also includes an additional program operation controller configured to determine, based on the normal program complete information, additional program cells that are memory cells on which an additional program operation is to be performed when a threshold voltage of a second memory cell coupled to a same bit line to which the first memory cell is coupled corresponds to an erased status, and provide an additional program command for performing an additional program operation on the additional program cells.

DETAILED DESCRIPTION

Figure 1:
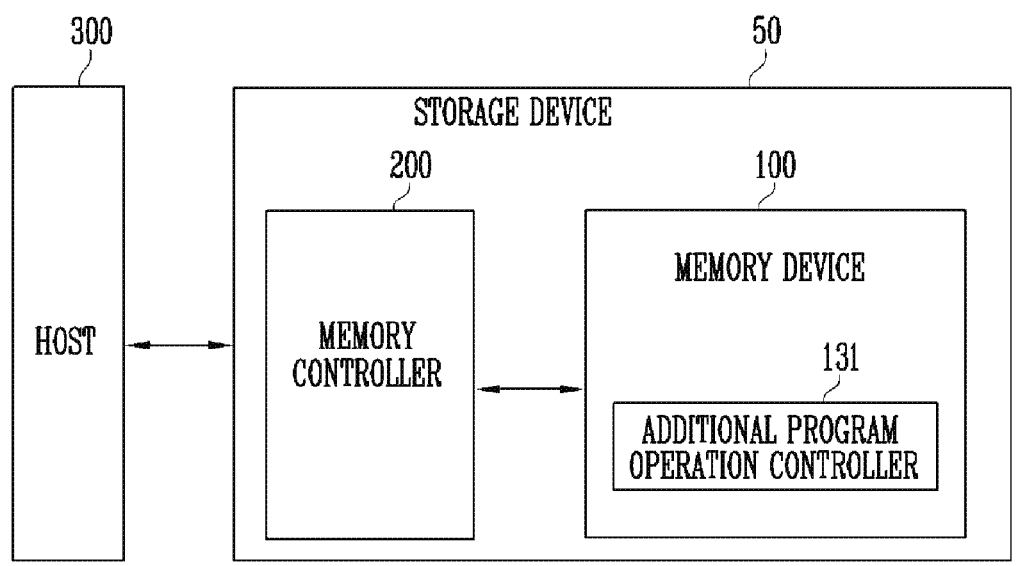
FIG. 1 is a diagram illustrating a storage device, in accordance with an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will now be described in detail based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, it is to be understood that the present description is not intended to limit the present disclosure to those exemplary embodiments, and the present disclosure is intended to cover not only the exemplary embodiments, but also various alternatives, modifications, equivalents and other embodiments that fall within the spirit and scope of the present disclosure.

It will be understood that, although the terms "first", "second", etc. may be used herein to describe various elements, these elements should not be limited by these terms. These terms are only used to distinguish one element from another element and not to indicate a number or order of elements. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to", or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Hereinafter, the present disclosure is explained in detail by describing exemplary embodiments of the present disclosure with reference to the accompanying drawings. Hereinafter, embodiments of the present disclosure are described in detail with reference to the attached drawings.

FIG. 1 illustrates a storage device 50 in accordance with an embodiment of the present disclosure.

Referring to FIG. 1, the storage device 50 may include a memory device 100 and a memory controller 200. The storage device 50 may be a device configured to store data under control of a host 300 such as a cellular phone, a smartphone, an MP3 player, a laptop computer, a desktop computer, a game machine, a TV, a tablet PC, or an in-vehicle infotainment system.

The storage device 50 may be implemented as any one of various kinds of data storage devices depending on a host interface, which is a communication system with the host 300. For example, the storage device 50 may be configured of any one of various kinds of storage devices such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of any one of various package types. For instance, the storage device 50 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data therein. The memory device 100 may be operated under control of the memory controller 200. The memory device 100 may include a memory cell array including a plurality of memory cells configured to store data therein.

The memory cells may be operated in the form of any one of a single-level cell (SLC) capable of storing a single data bit, a multi-level cell (MLC) capable of storing two data bits, a triple-level cell (TLC) capable of storing three data bits, and a quad-level cell (QLC) capable of storing four data bits.

The memory cell array may include a plurality of memory blocks. Each memory block may include a plurality of memory cells. The memory block may be the unit of erasing data stored in the memory device 100. In an embodiment, the memory block may include a plurality of pages. The page may be the unit of storing data in the memory device 100, or reading data from the memory device 100.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, for the sake of explanation, it is assumed that the memory device 100 is a NAND flash memory.

The memory device 100 may receive a command and an address from the memory controller 200 and access an area of the memory cell array that is selected by the address. In other words, the memory device 100 may perform an operation corresponding to the received command on the region selected by the address. For example, the memory device 100 may perform a program operation, a read operation, and an erase operation. The program operation may be an operation of storing data in memory cells included in the memory device 100. The memory device 100 may perform a program operation of storing data in an area selected by an address in response to a program command input from the memory controller 200. The read operation may be an operation of sensing, using a read voltage, data stored in memory cells. The memory device 100 may sense data stored in an area selected by an address in response to a read command input from the memory controller 200. The erase operation may an operation of erasing data stored in memory cells. The memory device 100 may erase data stored in an area selected by an address in response to an erase command input from the memory controller 200. In an embodiment, the words "erasing the data stored in the memory cells" may mean that the threshold voltages of the memory cells are reduced so that the threshold voltages of the memory cells are included in a threshold voltage distribution corresponding to an erased status.

In accordance with an embodiment of the present disclosure, the memory device 100 may include an additional program operation controller 131.

The additional program operation controller 131 may control the memory device 100 to perform a program operation in response to a program command provided from the memory controller 200. In detail, the additional program operation controller 131 may control the memory device 100 to perform a normal program operation and an additional program operation in response to a program command provided from the memory controller 200.

The additional program operation controller 131 may perform an additional program operation using information about a program voltage applied during the normal program operation. In an embodiment, the information about the program voltage may be information about a program start voltage and a program loop count, i.e., the number of times a step voltage or a program pulse has been applied.

The memory controller 200 may control overall operation of the memory device 100.

When power is applied to the storage device 50, the memory controller 200 may execute stored firmware. In the case where the memory device 100 is a flash memory device, the memory controller 200 may execute firmware such as a flash translation layer (FTL) for controlling communication between the host 300 and the memory device 100.

If a write request is input from the host 300, the memory controller 200 may receive from the host 300 data to be stored and a logical address (LA) for identifying the corresponding data. The memory controller 200 may translate the received logical address into a physical address (PA) indicating physical addresses of memory cells in which the data is to be stored among the memory cells included in the memory device 100. The memory controller 200 may provide, to the memory device 100, a program command for storing data, a translated physical address, and data to be stored.

In an embodiment, if a read request is input from the host 300, the memory controller 200 may receive, from the host 300, a logical address for identifying data to be read. The memory controller 200 may obtain a physical address corresponding to the input logical address, and provide a read command and a physical address to the memory device 100. In various embodiments, during an erase operation, the memory controller 200 may provide an erase command and a physical block address to the memory device 100.

In an embodiment, the memory controller 200 may autonomously control the memory device 100 to perform a program operation, a read operation, or an erase operation without a request from the host 300. For example, the memory controller 200 may control the memory device 100 to perform background operations such as a wear leveling operation, a garbage collection operation, and a read reclaim operation.

The host 300 may communicate with the storage device 50 using at least one of various communication methods, such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
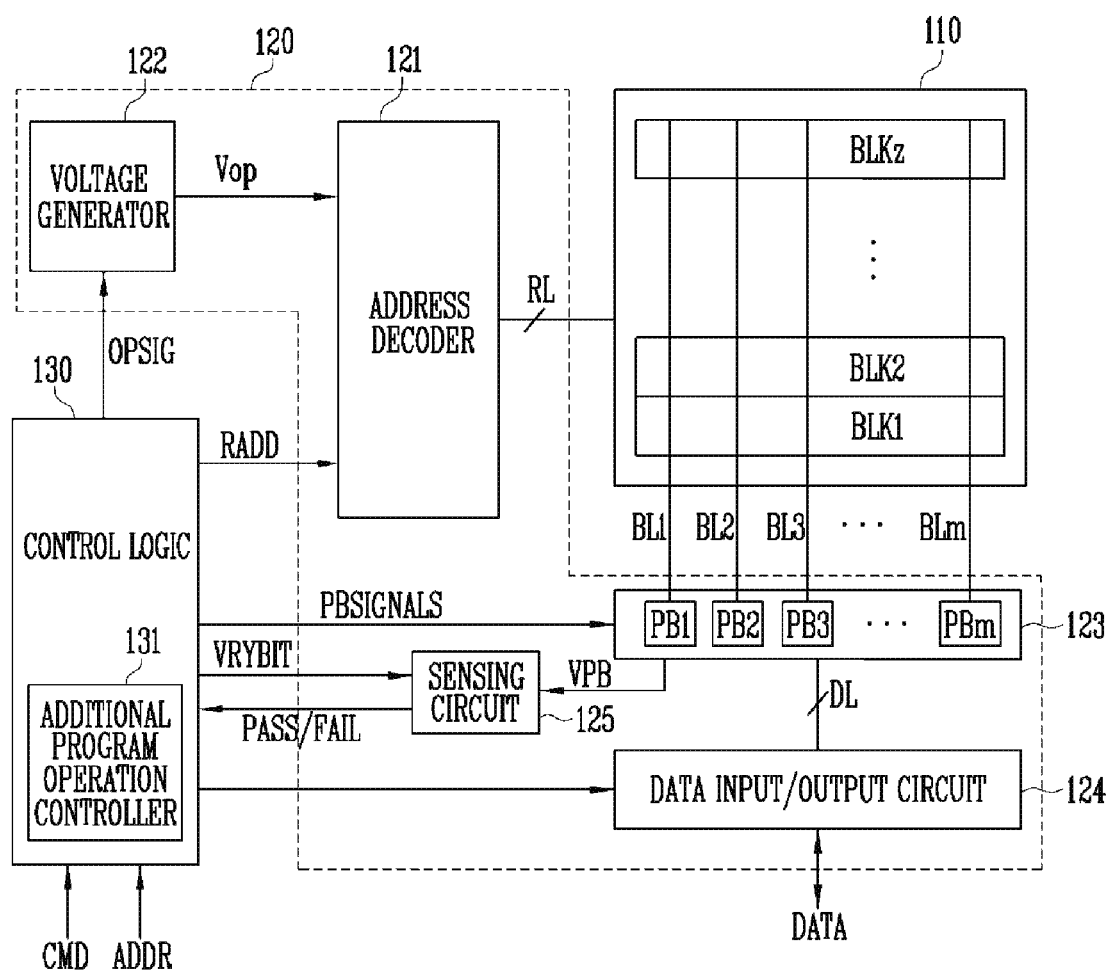
FIG. 2 is a diagram illustrating a configuration of a memory device of FIG. 1.

FIG. 2 is a diagram illustrating a configuration of the memory device 100 of FIG. 1.

Referring to FIG. 2, the memory device 100 may include a memory cell array 110, a peripheral circuit 120, and control logic 130.

The memory cell array 110 may include a plurality of memory blocks BLK1 to BLKz. The plurality of memory blocks BLK1 to BLKz may be coupled to an address decoder 121 through row lines RL. The memory blocks BLK1 to BLKz may be coupled to a read/write circuit 123 through bit lines BL1 to BLm. Each of the memory blocks BLK1 to BLKz may include a plurality of memory cells. In an embodiment, the plurality of memory cells may be nonvolatile memory cells. Memory cells that are coupled to the same word line among the plurality of memory cells may be defined as a single physical page. Hence, each memory block may include a plurality of physical pages. Each memory cell included in the memory block may be used in the form of any one of a single-level cell (SLC) capable of storing a single bit of data, a multi-level cell (MLC) capable of storing two bits of data, a triple-level cell (TLC) capable of storing three bits of data, and a quad-level cell (QLC) capable of storing four bits of data.

The peripheral circuit 120 may include an address decoder 121, a voltage generator 122, a read/write circuit 123, a data input/output circuit 124, and a sensing circuit 125.

The peripheral circuit 120 may drive the memory cell array 110. For example, the peripheral circuit 120 may drive the memory cell array 110 to perform a program operation, a read operation, or an erase operation.

The voltage generator 122 may generate a plurality of operating voltages Vop using an external supply voltage supplied to the memory device 100. The voltage generator 122 may operate under control of the control logic 130. In detail, the voltage generator 122 may generate operating voltages Vop to be used for a program operation, a read operation, and an erase operation in response to an operating signal OPSIG. For example, the voltage generator 122 may generate a program voltage, a verify voltage, a pass voltage, a program pass voltage, a verify pass voltage, a read voltage, an erase voltage, and so forth under control of the control logic 130.

In an embodiment, the voltage generator 122 may include a plurality of pumping capacitors to generate a plurality of operating voltages Vop having various voltage levels. The voltage generator 122 may selectively enable the plurality of pumping capacitors in response to control of the control logic 130 to generate a plurality of operating voltages Vop. The generated operating voltages Vop may be supplied to the memory cell array 110 by the address decoder 121.

The address decoder 121 is coupled to the memory cell array 110 through the row lines RL. The row lines RL may include drain select lines, word lines, source select lines, and a common source line. In various embodiments, the word lines may include normal word lines and dummy word lines. In an embodiment, the row lines RL may further include a pipe select line.

The address decoder 121 may operate under control of the control logic 130. The address decoder 121 may transmit, in response to a row address RADD from the control logic 130, operating voltages Vop generated by the voltage generator 122 to row lines RL coupled to a memory block selected from among the plurality of memory blocks BLK1 to BLKz.

The read/write circuit 123 may include first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may operate under control of the control logic 130. In detail, the first to m-th page buffers PB1 to PBm may operate in response to page buffer control signals PBSIGNALS.

In an embodiment, the first to m-th page buffers PB1 to PBm may sense data stored in the memory cell array 110 by sensing voltage or current of the first to m-th bit lines BL1 to BLm. The first to m-th page buffers PB1 to PBm may temporarily store the sensed data. The first to m-th page buffers PB1 to PBm may provide the sensed data to the data input/output circuit 124 through the data lines DL.

In an embodiment, the first to m-th page buffers PB1 to PBm may receive data to be stored from the data input/output circuit 124 through data lines DL. The data received by the first to m-th page buffers PB1 to PBm when performing a program operation may be stored in the memory cell array 110.

The program operation of storing data in memory cells may include a program voltage application step and a verify step. At the program voltage application step, when a program voltage is applied to a selected word line, the first to m-th page buffers PB1 to PBm may transmit, to selected memory cells, data to be stored. Memory cells coupled to a bit line to which a program enable voltage (e.g. a ground voltage) is applied may have increased threshold voltages. Threshold voltages of memory cells coupled to a bit line to which a program inhibit voltage (for example, a power supply voltage) is applied may be retained. At the program verify step of verifying the program operation, the first to m-th page buffers PB1 to PBm may sense data from selected memory cells through the bit lines BL1 to BLm.

At the verify step, the sensing circuit 125 may generate a reference current in response to an enable bit VRYBIT, and may compare a sensing voltage VPB received from the read/write circuit 123 with a reference voltage generated by the reference current and output a pass signal PASS or a fail signal FAIL.

The data input/output circuit 124 may be coupled to the first to m-th page buffers PB1 to PBm through the data lines DL. The data input/output circuit 124 may operate under control of the control logic 130.

The control logic 130 may receive a command CMD and an address ADDR from the memory controller 200 of FIG. 1 and may control the peripheral circuit 120 in response to the command CMD and the address ADDR. The data input/output circuit 124 may provide, to the read/write circuit 123, data DATA received from the memory controller 200 of FIG. 1.

In an embodiment, the data input/output circuit 124 may include a plurality of input/output buffers (not shown) for receiving data DATA. During a program operation, the data input/output circuit 124 may receive data DATA to be stored from the memory controller 200. During a read operation, the data input/output circuit 124 may output, to the memory controller 200, the data received from the first to m-th page buffers PB1 to PBm included in the read/write circuit 123.

The control logic 130 may be coupled to the address decoder 121, the voltage generator 122, the read/write circuit 123, the data input/output circuit 124, and the sensing circuit 125. The control logic 130 may be implemented as hardware, software, or a combination of hardware and software. For example, the control logic 130 may be a control logic circuit operating in accordance with an algorithm and/or a processor executing control logic code. The control logic 130 may control the overall operation of the memory device 100. The control logic 130 may generate a plurality of control signals to control the peripheral circuit 120 in response to a command CMD and an address ADDR. For example, the control logic 130 may generate an operating signal OPSIG, a row address RADD, page buffer control signals PBSIGNALS, and an enable bit VRYBIT in response to the command CMD and the address ADDR. The control logic 130 may determine whether target memory cells have passed or failed a verification during the verify operation in response to a pass signal PASS or a fail signal FAIL that is output from the sensing circuit 125.

In an embodiment of the present disclosure, the control logic 130 may further include an additional program operation controller 131.

In response to an input program command, the additional program operation controller 131 may control the memory device 100 such that the memory device 100 performs a program operation including a normal program operation and an additional program operation.

As the program operation is performed, memory cells coupled to a selected word line may store data. Each of the memory cells may have a target programmed status corresponding to any one of a plurality of programmed statuses depending on the data to be stored. The program operation may be an operation of increasing a threshold voltage of each of the memory cells so that the threshold voltage of each memory cell belongs to a threshold voltage distribution corresponding to a target programmed status.

For example, depending on data to be stored, each memory cell may have any one of the first to n-th programmed statuses as the target programmed status. Here, the number of programmed statues may change depending on the number of bits of data to be stored in the memory cell.

The level of the threshold voltage corresponding to each programmed status may be lowest in a first programmed status and highest in an n-th programmed status. The program operation may be performed in a sequence from a programmed status corresponding to a low threshold voltage distribution to a programmed status corresponding to a high threshold voltage distribution.

In an embodiment, the first programmed status may be an erased status. Before the program operation is performed, the memory cells each may have a threshold voltage corresponding to the erased status.

In an embodiment of the present disclosure, the normal program operation may include a plurality of program loops. Each program loop may include a program voltage application step and a verify step. Each time a program loop is performed, the level of a program voltage may increase by the level of a preset step voltage compared to the level of a program voltage applied in a preceding program loop. The verify step may be a step of determining whether the threshold voltage of each memory cells has reached a threshold voltage corresponding to the target programmed status.

In an embodiment, the additional program operation may be a program operation which is performed after the normal program operation has been completed. During the additional program operation, the additional program operation controller 131 may select additional program cells that are memory cells to which an additional program voltage is to be applied, and apply the additional program voltage to the additional program cells.

In detail, if the normal program operation is completed, the additional program operation controller 131 may select additional program cells that are memory cells to which the additional program voltage is to be applied among memory cells coupled to a selected word line. The additional program cells may be memory cells, to which memory cells having threshold voltages corresponding to an erased status are adjacent, among memory cells coupled to the selected word line. For example, if the normal program operation is completed, the additional program operation controller 131 may apply the additional verify voltage to the selected word line and an adjacent word line and thus discriminate memory cells corresponding to the erased status among memory cells coupled to the adjacent word line. In an embodiment, the additional verify voltage may be a read voltage for distinguishing an erased status and a programmed status from each other.

The additional program operation controller 131 may control the peripheral circuit 120 to apply an additional program voltage to the additional program cells. In an embodiment, the additional program voltage may have a voltage level higher by a preset step voltage than the program voltage applied in the preceding program loop.

In an embodiment, the additional program operation may be performed for each of the plurality of programmed statuses. Alternatively, the additional program operation may be performed for only a programmed status corresponding to the highest threshold voltage distribution among the plurality of programmed statuses.

Figure 3:
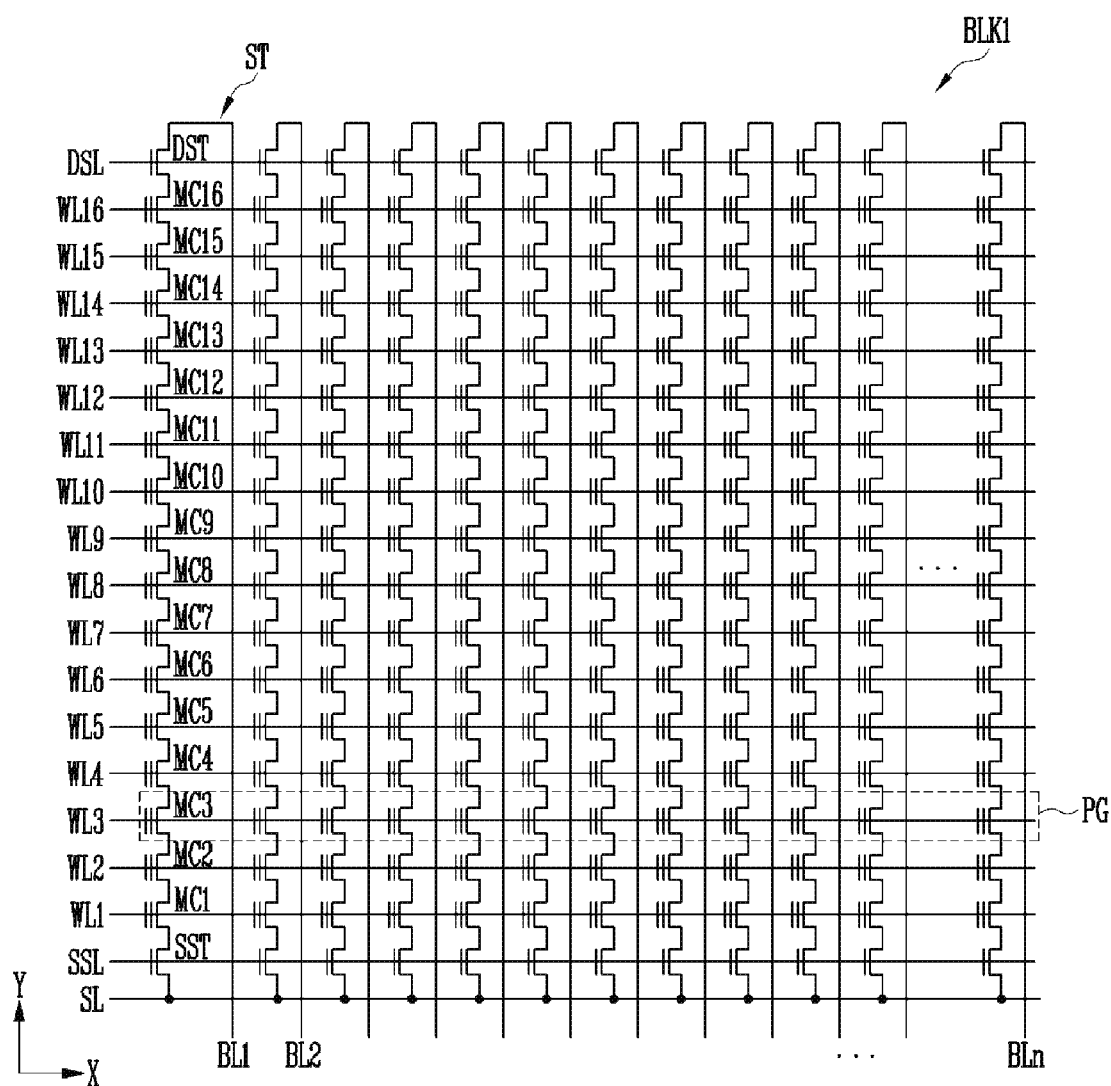
FIG. 3 is a diagram illustrating a structure of a memory block of FIG. 2.

FIG. 3 is a diagram illustrating the structure of any one memory block of the memory blocks BLK1 to BLKz of FIG. 2, for example, memory block BLK1.

Referring to FIG. 3, in the memory block BLK1, a plurality of word lines arranged parallel to each other may be arranged between a first select line and a second select line. Here, the first select line may be a source select line SSL, and the second select line may be a drain select line DSL. In more detail, the memory block BLK1 may include a plurality of strings ST coupled between the bit lines BL1 to BLn and the source line SL. The bit lines BL1 to BLn of FIG. 3 may be first to m-th bit lines BL1 to BLm of FIG. 2. The bit lines BL1 to BLn may be respectively coupled to the strings ST, and the source lines SL may be coupled in common to the strings ST. The strings ST may have the same configuration; therefore, the string ST that is coupled to the first bit line BL1 will be described in detail by way of example.

The string ST may include a source select transistor SST, a plurality of memory cells MC1 to MC16, and a drain select transistor DST which are coupled in series to each other between the source line SL and the first bit line BL1. At least one source select transistor SST and at least one drain select transistor DST may be included in each string ST, and a larger number of memory cells than the number of memory cells MC1 to MC16 shown in the drawing may be included in each string ST.

A source of the source select transistor SST may be coupled to the source line SL, and a drain of the drain select transistor DST may be coupled to the first bit line BL1. The memory cells MC1 to MC16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells MC1 to MC16 may be coupled to the plurality of word lines WL1 to WL16. Among the memory cells included in different strings ST, a group of memory cells coupled to each word line may be referred to as a physical page PG. Therefore, the number of physical pages PG included in the memory block BLK1 may correspond to the number of word lines WL1 to WL16. The source line SL, the source select line SSL, the word lines WL1 to WL16, and the drain select line DSL that are shown in FIG. 3 may be included in the row lines RL of FIG. 2.

In the case where each memory cell is a single-level cell (SLC) capable of storing one bit of data, each physical page PG may store one logical page (LPG) of data. Each memory cell may store two or more bits of data. In this case, each physical page PG may store two or more LPGs of data.

Figure 4:
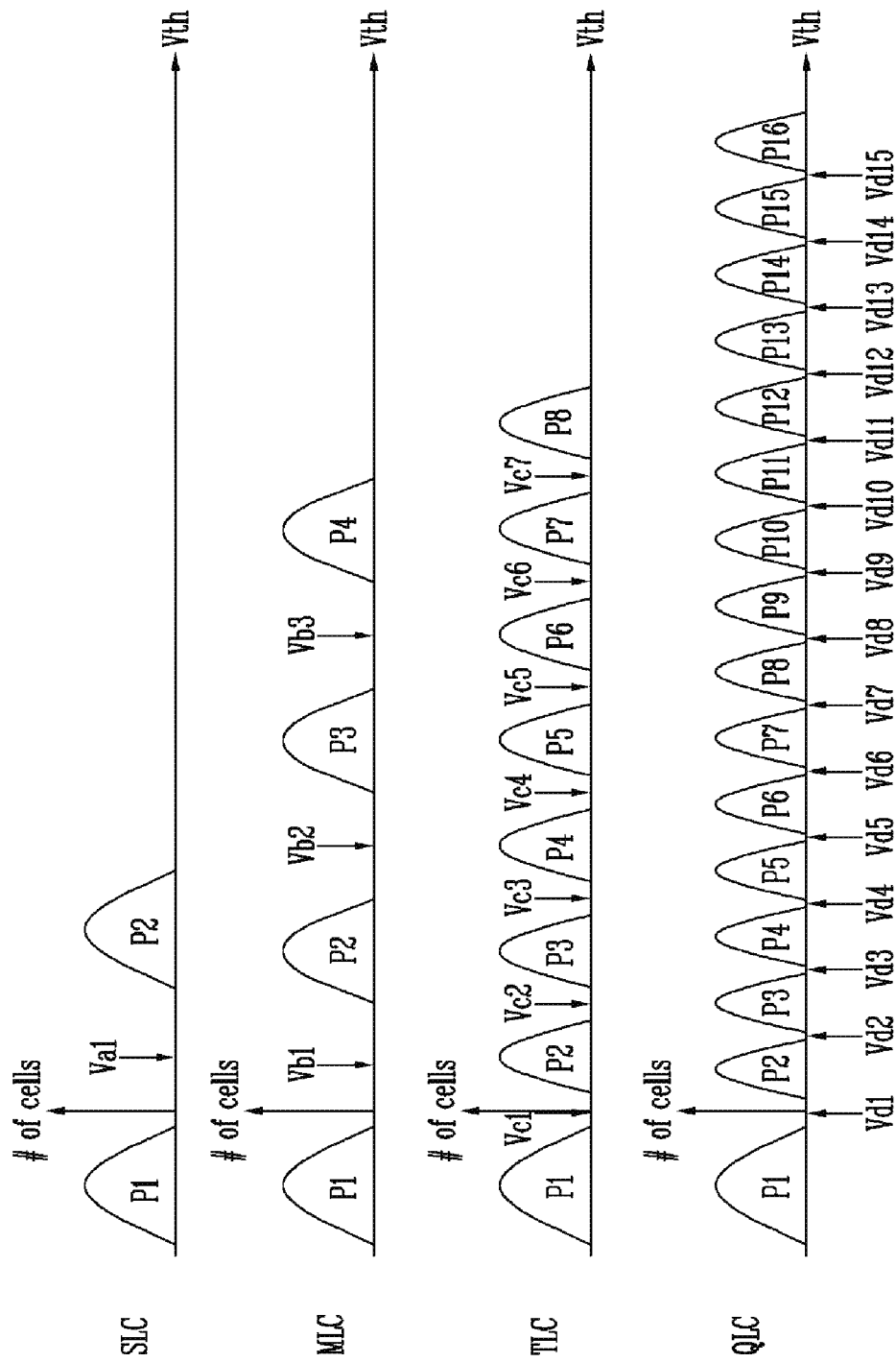
FIG. 4 is a diagram illustrating threshold voltage distributions depending on a number of bits which may be stored in a memory cell, in accordance with an embodiment of the present disclosure.

FIG. 4 is a diagram illustrating threshold voltage distributions depending on the number of bits which may be stored in a memory cell, in accordance with an embodiment of the present disclosure.

Referring to FIG. 4, the horizontal axis of each graph indicates the level of a threshold voltage, and the vertical axis thereof indicates the number of memory cells.

In the case where each memory cell is an SLC capable of storing one bit of data, the memory cell may have a threshold voltage corresponding to any one status of a first programmed status P1 and a second programmed status P2.

A read voltage Va1 may be a read voltage for distinguishing the first programmed status P1 from the second programmed status P2. Each memory cell having the first programmed status P1 may be read as an On cell because the memory cell has a threshold voltage lower than the read voltage Va1. Each memory cell having the second programmed status P2 may be read as an Off cell because the memory cell has a threshold voltage higher than the read voltage Va1.

In the case where each memory cell is an MLC capable of storing two bits of data, the memory cell may have a threshold voltage corresponding to any one status of first to fourth programmed statuses P1 to P4.

First to third read voltages Vb1 to Vb3 may be read voltages for distinguishing the first to fourth programmed statuses P1 to P4 from each other. The first read voltage Vb1 may be a read voltage for distinguishing the first programmed status P1 from the second programmed status P2. The second read voltage Vb2 may be a read voltage for distinguishing the second programmed status P2 from the third programmed status P3. The third read voltage Vb3 may be a read voltage for distinguishing the third programmed status P3 from the fourth programmed status P4.

In the case where each memory cell is a TLC capable of storing three bits of data, the memory cell may have a threshold voltage corresponding to any one status of first to eighth programmed statuses P1 to P8.

First to seventh read voltages Vc1 to Vc7 may be read voltages for distinguishing the first to eighth programmed statuses P1 to P8 from each other. The first read voltage Vc1 may be a read voltage for distinguishing the first programmed status P1 from the second programmed status P2. The second read voltage Vc2 may be a read voltage for distinguishing the second programmed status P2 from the third programmed status P3. Likewise, the seventh read voltage Vc7 may be a read voltage for distinguishing the seventh programmed status P7 from the eighth programmed status P8.

In the case where each memory cell is a QLC capable of storing four bits of data, the memory cell may have any one status of first to sixteenth programmed statuses P1 to P16.

First to fifteenth read voltages Vd1 to Vd15 may be read voltages for distinguishing the first to sixteenth programmed statuses P1 to P16 from each other. The first read voltage Vd1 may be a read voltage for distinguishing the first programmed status P1 from the second programmed status P2. The second read voltage Vd2 may be a read voltage for distinguishing the second programmed status P2 from the third programmed status P3. Likewise, the fifteenth read voltage Vd15 may be a read voltage for distinguishing the fifteenth programmed status P15 from the sixteenth programmed status P16.

As the number of data bits which may be stored in each memory cell is increased, the number of programmed statuses and the number of read voltages for distinguishing programmed statuses from each other may be increased.

Figure 5:
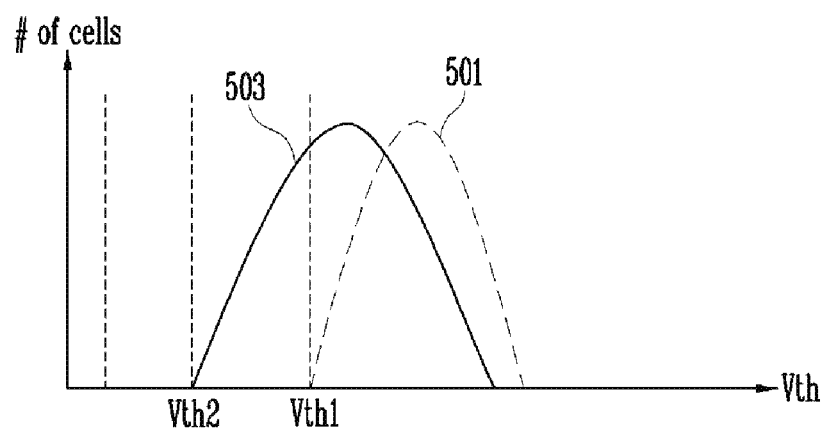
FIG. 5 is a diagram illustrating variation of a threshold voltage distribution of a programmed memory cell when a cell adjacent to the programmed memory cell is in a programmed status, in accordance with an embodiment of the present disclosure.

FIG. 5 is a diagram illustrating variation of a threshold voltage distribution of a programmed memory cell when a cell adjacent to the programmed memory cell is in a programmed status, in accordance with an embodiment of the present disclosure.

Figure 6:
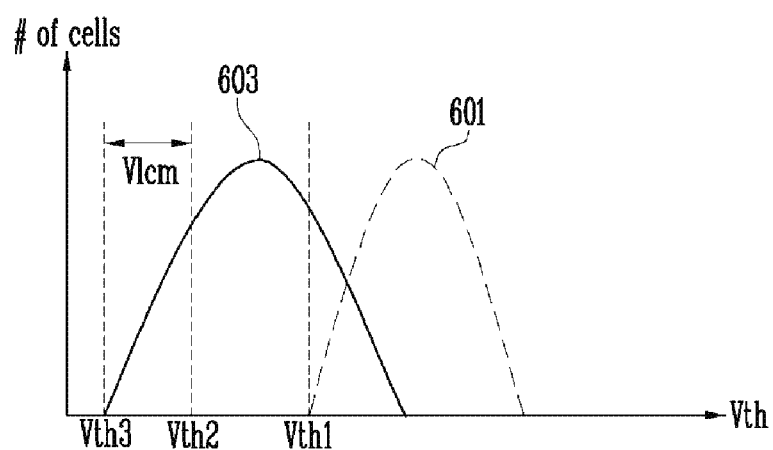
FIG. 6 is a diagram illustrating variation of a threshold voltage distribution of a programmed memory cell when a cell adjacent to the programmed memory cell is in an erased status, in accordance with an embodiment of the present disclosure.

FIG. 6 is a diagram illustrating variation of a threshold voltage distribution of a programmed memory cell when a cell adjacent to the programmed memory cell is in an erased status, in accordance with an embodiment of the present disclosure.

Referring to FIG. 5, a threshold voltage distribution 501 of memory cells that is indicated by a dotted line may be a threshold voltage distribution immediately after a program operation on a memory cell coupled to a selected word line has been completed. A threshold voltage distribution 503 of memory cells that is indicated by a solid line may be a threshold voltage distribution after a significant amount of time has passed after a program operation has been performed on the memory cells.

A lowest threshold voltage among threshold voltages that a first memory cell may have immediately after the program operation has been performed may be Vth1. A lowest threshold voltage among threshold voltages that the first memory cell may have after a significant amount of time has passed after the program operation has been performed may be Vth2. The program operation may be an operation of increasing a threshold voltage by increasing the number of electrons in a memory cell. If a significant amount of time passes after the program operation has been performed, electrons are removed from the memory cell, so that the threshold voltage may be reduced. This is referred to as "retention effect".

Referring to FIG. 6, a threshold voltage distribution 601 of memory cells that is indicated by a dotted line may be a threshold voltage distribution immediately after a program operation on memory cells coupled to a selected word line has been completed. A threshold voltage distribution 603 of memory cells that is indicated by a solid line may be a threshold voltage distribution after a significant amount of time has passed after a program operation has been performed on the memory cells.

A lowest threshold voltage among threshold voltages that a memory cell may have immediately after the program operation has been performed may be Vth1. A lowest threshold voltage among threshold voltages that the memory cell may have after a significant amount of time has passed after the program operation has been performed may be Vth3.

Comparing FIGS. 5 and 6 to each other, in the case where a memory cell adjacent to a programmed memory cell has an erased status, the degree to which the threshold voltage of the programmed memory cell is reduced is greater than that (by Vlcm as illustrated) of the case where the adjacent memory cell has a programmed status.

The reason for this is because memory cells coupled to the same string share a channel area. In detail, in a 3D NAND flash memory cell array structure, memory cells coupled to the same string share a charge storage layer CTN. Therefore, a phenomenon in which electrons trapped to the charge storage layer of the programmed memory cell moves to a lower portion of an adjacent memory cell may occur. In this case, if the adjacent memory cell has an erased status, the number of electrons that move may increase.

Figure 7:
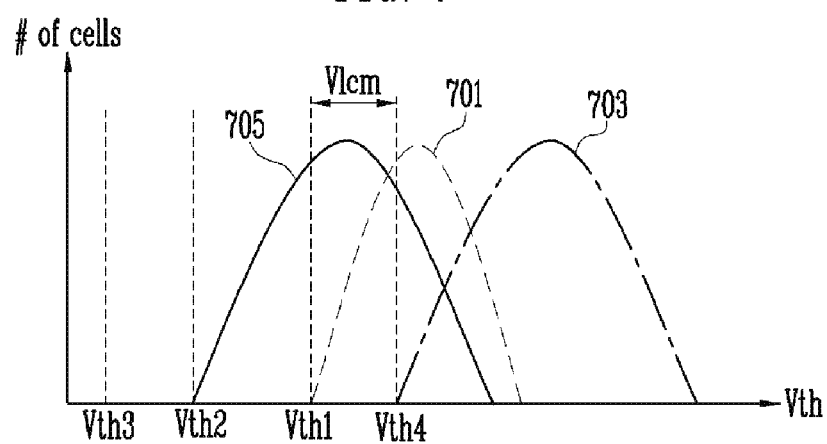
FIG. 7 is a diagram illustrating a threshold voltage distribution of a memory cell after an additional program operation has been performed, in accordance with an embodiment of the present disclosure.

FIG. 7 is a diagram illustrating a threshold voltage distribution of a memory cell after an additional program operation has been performed, in accordance with an embodiment of the present disclosure.

Referring to FIG. 7, a threshold voltage distribution 701 of memory cells that is indicated by a dotted line may be a threshold voltage distribution immediately after a program operation on memory cells coupled to a selected word line has been completed. A threshold voltage distribution 703 of memory cells that is indicated by an alternated long and short dash line may be a threshold voltage distribution of memory cells on which an additional program operation in accordance with an embodiment has been performed. A threshold voltage distribution 705 of memory cells that is indicated by a solid line may be a threshold voltage distribution after a significant amount of time has passed after a normal program operation and the additional program operation have been performed on the memory cells.

A lowest threshold voltage among threshold voltages that a memory cell may have immediately after the program operation has been performed may be Vth1. In the case where an additional program operation is not performed, a lowest threshold voltage among threshold voltages that the memory cell may have after a significant amount of time has passed after the program operation has been performed may be Vth3. A lowest threshold voltage that the memory cell may have after the normal program operation and the additional program operation have been performed may be Vth4. A lowest threshold voltage that the memory cell may have after a significant amount of time has passed after the normal program operation and the additional program operation have been performed may be Vth2.

If the additional program operation in accordance with an embodiment of the present disclosure, the threshold voltage of the memory cell may increase from Vth1 to Vth4. Due to the additional program operation, the threshold voltage of the memory cell may previously increase by a predetermined level. Here, the level of the threshold voltage that increases during the additional program operation may correspond to the difference Vlcm in decrement of the threshold voltage of the memory cell between the case where the adjacent cell has a programmed status (shown in FIG. 5) and the case where the adjacent cell has an erased status (shown in FIG. 6). Therefore, even if a significant amount of time has passed after the additional program operation has been performed, the degree to which the threshold voltage is reduced may be maintained, by the retention effect, in the same level as that of the case where the adjacent cell has a programmed status. Stated another way, because the memory cell adjacent to a memory cell having an erased status receives an additional program operation, its threshold voltage starts at a higher voltage as compared to the threshold voltage of the memory cell adjacent to a memory cell having a programmed status which did not receive the additional program operation. After the passage of time, both programmed cells will have approximately the same threshold voltage because the memory cell which reduces its threshold voltage faster was programmed to a greater threshold voltage by the additional program operation, which was not received by the memory cell adjacent to a memory cell having a programmed status.

Figure 8:
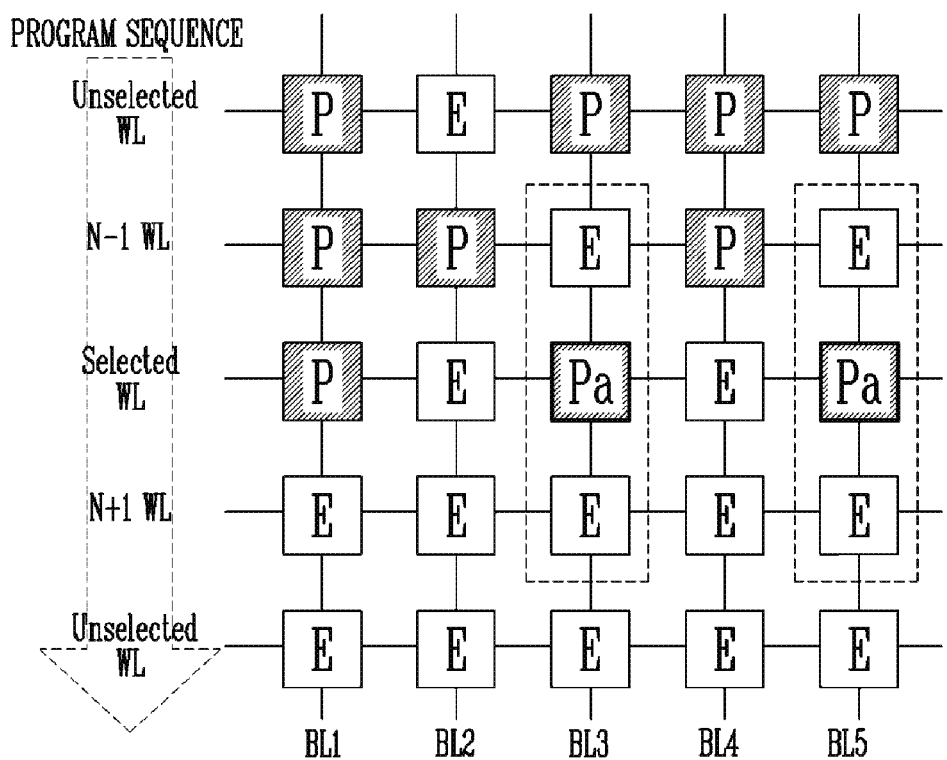
FIG. 8 is a diagram illustrating an additional program operation, in accordance with an embodiment of the present disclosure.

FIG. 8 is a diagram illustrating an additional program operation in accordance with an embodiment of the present disclosure.

Referring to FIG. 8, there are illustrated a plurality of memory cells which are coupled to a plurality of bit lines BL1 to BL5 and a plurality of word lines Unselected WL, N−1 WL, Selected WL, N+1 WL, and Unselected WL.

Memory cells on which a program operation is to be performed may be memory cells coupled to a selected word line Selected WL. The program operation may be performed in a sequence of word lines. Therefore, memory cells coupled both to an N−1th word line N−1 WL on which a program operation has been performed before a program operation is performed on the selected word line Selected WL and to the unselected word line Unselected WL that is adjacent to the N−1-th word line N−1 WL may be in a programmed status.

In contrast, memory cells coupled both to an N+1-th word line N+1 WL that is a word line to be programmed next to the selected word line among word lines adjacent to the selected word line and to the unselected word line Unselected WL disposed adjacent to the N+1-th word line N+1 WL may be before a program operation has been performed on the memory cells. Therefore, all of the memory cells that are to be programmed after the selected word line Selected WL has been programmed may be erased cells E each having a threshold voltage corresponding to an erased status.

The additional program operation may be performed on memory cells to which memory cells each having an erased status are adjacent among programmed memory cells coupled to the selected word line Selected WL.

Therefore, among the memory cells coupled to the selected word line Selected WL, a memory cell coupled to the third bit line BL3 and a memory cell coupled to the fifth bit line BL5 may be additional program cells Pa that are memory cells on which the additional program operation is to be performed.

In an embodiment, to discriminate erased cells from among the memory cells coupled to the N−1-th word line N−1 WL, an additional verify voltage may be applied to the N−1-th word line N−1 WL. In various embodiments, the level of the additional verify voltage to be applied to the N−1-th word line N−1 WL may be regardless of the number of bits of data stored in the memory cell. The reason for this is because the discrimination of the memory cell on which the additional program operation is performed may be realized only by determining whether an adjacent memory cell is in an erased status.

Even in the case where two or more bits of data are stored in each memory cell, an additional verify voltage equal to that of the case where one bit of data is stored in each memory cell may be used because the additional verify voltage to be applied to the memory cells coupled to the N−1-th word line N−1 WL does not need to precisely read data for each memory cell.

Figure 9:
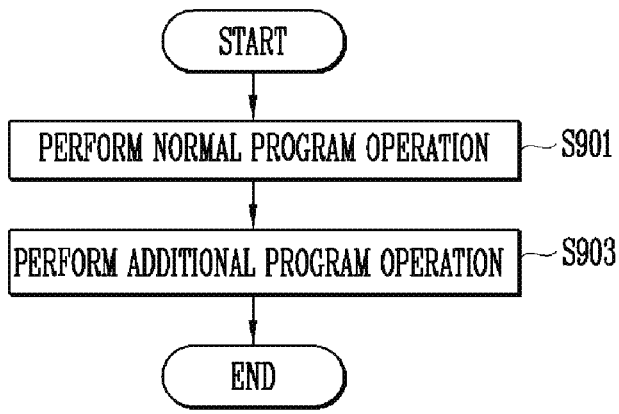
FIG. 9 is a flowchart illustrating an operation of a memory device, in accordance with an embodiment of the present disclosure.

FIG. 9 is a flowchart for describing an operation of the memory device 100 in accordance with an embodiment of the present disclosure.

Referring to FIG. 9, at step S901, the memory device 100 may perform a normal program operation. After having performed the normal program operation, the memory device may perform an additional program operation, at step S903. In an embodiment, step S901 and S903 may be performed in response to a program command provided form the memory controller 200.

In various embodiments, the additional program operation at step S903 may be performed on each of a plurality of programmed statuses or only on a programmed status corresponding to a highest threshold voltage distribution among the plurality of programmed statuses.

Figure 10:
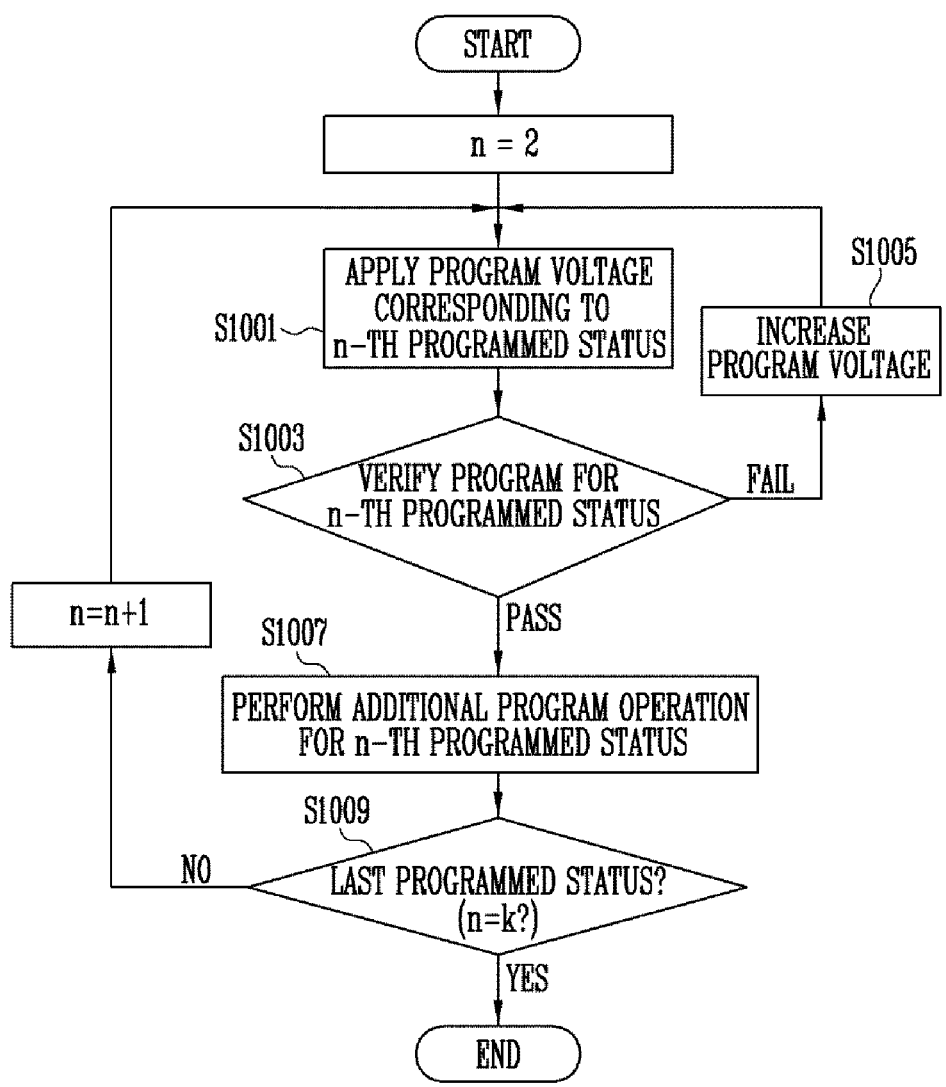
FIG. 10 is a flowchart illustrating a normal program operation and an additional program operation of FIG. 9.

FIG. 10 is a flowchart for describing in detail a normal program operation and an additional program operation of FIG. 9.

Referring to FIG. 10, the memory device may perform a program operation such that each selected memory cell has a threshold voltage corresponding to any one of first to k-th programmed statuses. Here, the first programmed status may be an erased status. Furthermore, k is a natural number equal to or greater than n. The threshold voltage of the memory cell corresponds to an erased status before a program operation is performed. Therefore, in the case where n is 2, the program operation may start from memory cells having a second programmed status as a target programmed status.

At step S1001, the memory device may apply a program voltage corresponding to an n-th programmed status. In detail, the memory device may apply the program voltage to a selected word line and apply a program pass voltage to unselected word lines. The program pass voltage may be a voltage having a level high enough to turn on the memory cell regardless of the threshold voltage of the memory cell. The program pass voltage may have a voltage level lower than the program voltage.

At step S1003, the memory device 100 may verify whether the threshold voltage of the memory cell has reached the n-th programmed status. In detail, the memory device may apply a verify voltage corresponding to the n-programmed status to the selected word line and apply a verify pass voltage to the unselected word lines. The memory cells each may be sensed as an On cell or an Off cell depending on the threshold voltage thereof. An Off cell may be a memory cell having a threshold voltage higher than a verify voltage. An On cell may be a memory cell having a threshold voltage lower than the verify voltage. If the number of off cells is equal to or less than a preset verify enable bit count, the verification passes, and the process proceeds to step S1007. In contrast, if the number of Off cells is greater than the preset verify enable bit count, the verification fails, and the process proceeds to step S1005. At step S1005, the program voltage may increase by a preset step voltage.

At step S1007, the memory device may perform an additional program operation for the n-th programmed status.

During the additional program operation, the memory device may select additional program cells that are memory cells on which the additional program operation is to be performed. Thereafter, the memory device may apply an additional program voltage to the selected additional program cells. In detail, the memory device may apply an additional verify voltage to an adjacent word line on which the program operation has been performed earlier than the selected word line. The additional verify voltage may be a voltage for distinguishing memory cells each having an erased status from memory cells each having a programmed status. Memory cells having threshold voltages higher than the additional verify voltage may be sensed as Off cells. Memory cells having threshold voltages lower than the additional verify voltage may be sensed as On cells. Each of the memory cells sensed as On cells may have a threshold voltage corresponding to an erased status.

Subsequently, the memory device may determine that memory cells to which a word line including memory cells each having an erased status is adjacent among the memory cells each having the n-th programmed status are additional program cells. The memory device may apply program voltages to the additional program cells. Program enable voltages may be applied to bit lines coupled to the additional program cells. Program inhibit voltages may be applied to bit lines coupled with memory cells other than the additional program cells among the memory cells coupled to the selected word line. In an embodiment, the program enable voltage may be 0 V, and the program inhibit voltage may be a power supply voltage (e.g., Vcc).

At step S1009, the memory device 100 may determine whether the n-th programmed status corresponds to a last programmed status having the highest threshold voltage among the plurality of programmed statuses. If a result of the determination indicates that the n-th programmed status corresponds to the k-th programmed status that is the highest programmed status, the program operation ends. In contrast, if n is less than k, the process returns to step S1001, and a program operation may be performed for a subsequent programmed status.

In an embodiment, steps S1001 to S1005 may correspond to step S901 of FIG. 9, and step S1007 may correspond to step S903 of FIG. 9.

Figure 11:
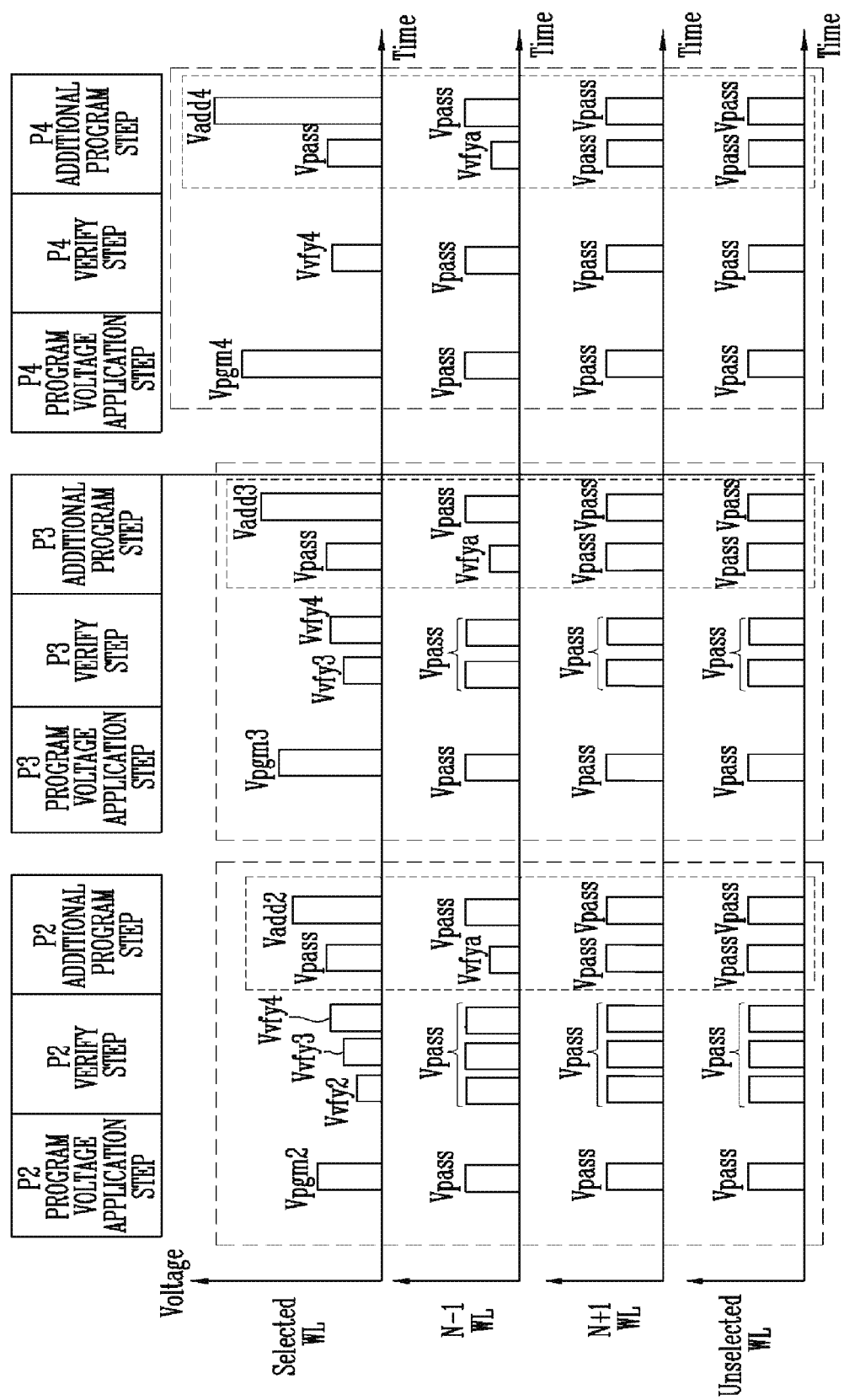
FIG. 11 is a diagram illustrating voltages applied to respective word lines during a program operation, in accordance with an embodiment of FIG. 10.

FIG. 11 is a diagram for describing voltages to be applied to respective word lines during a program operation in accordance with an embodiment of FIG. 10.

FIG. 11 is a diagram illustrating the case where each memory cell is an MLC capable of storing two bits of data. However, the number of bits of data that may be stored in a memory cell is not limited to that of this embodiment of the present disclosure.

A program operation may be performed by repeatedly performing program loops each including a program voltage application step and a verify step. In the embodiment of FIG. 11, if each programmed status passes a verification, an additional program operation corresponding to the related programmed status may be performed.

As the program operation is performed, each of the memory cells may have a threshold voltage corresponding to any one of second to fourth programmed statuses P2 to P4.

First, a program operation for a P2-programmed status is performed.

At a P2-program voltage application step, a program voltage Vpgm2 corresponding to a second programmed status may be applied to a selected word line Selected WL. Program pass voltages Vpass may be applied to the other word lines including an N−1-th word line N−1 WL, an N+1-th word line N+1 WL, and unselected word lines Unselected WL.

At a P2-verify step, second to fourth verify voltages Vvfy2 to Vvfy4 may be sequentially applied to the selected word line Selected WL. In various embodiments, only the second verify voltage Vvfy2 may be applied, and the third verify voltage Vvfy3 and the fourth verify voltage Vvf4 may not be applied. Verify pass voltages Vpass may be applied to the other word lines including an N−1-th word line N−1 WL, an N+1-th word line N+1 WL, and unselected word lines Unselected WL. As a result of the verification, it is assumed that memory cells to be programmed to the P2-programmed status have passed a verification. Thereafter, an additional program operation for the P2-programmed status may be performed.

The P2 additional program operation may include an additional verify step and an additional program voltage application step.

An additional verify voltage Vvfya may be applied to the N−1-th word line N−1 WL on which the program operation has been performed among the word lines adjacent to the selected word line Selected WL. Verify pass voltages Vpass may be applied to the other word lines including the selected word line Selected WL, the N+1-th word line N+1 WL, and the unselected word lines Unselected WL. At the additional verify step, memory cells each having an erased status among memory cells coupled to the N−1-th word line may be discriminated.

Thereafter, an additional program voltage Vadd2 for a P2 programmed status may be applied to the selected word line Selected WL. Here, program enable voltages may be applied to bit lines coupled with the additional program cells among the memory cells coupled to the selected word line Selected WL. Program inhibit voltages may be applied to bit lines coupled with the other memory cells except the additional program cells. The level of the additional program voltage Vadd2 for the P2 programmed status may be a voltage higher by a step voltage than the program voltage Vpgm2 applied to the word line when having passed the verification for the P2 program.

Thereafter, program operations for a P3 programmed status and a P4 programmed status may be performed in the same manner as the program operation for the above-mentioned P2 programmed status.

Figure 12:
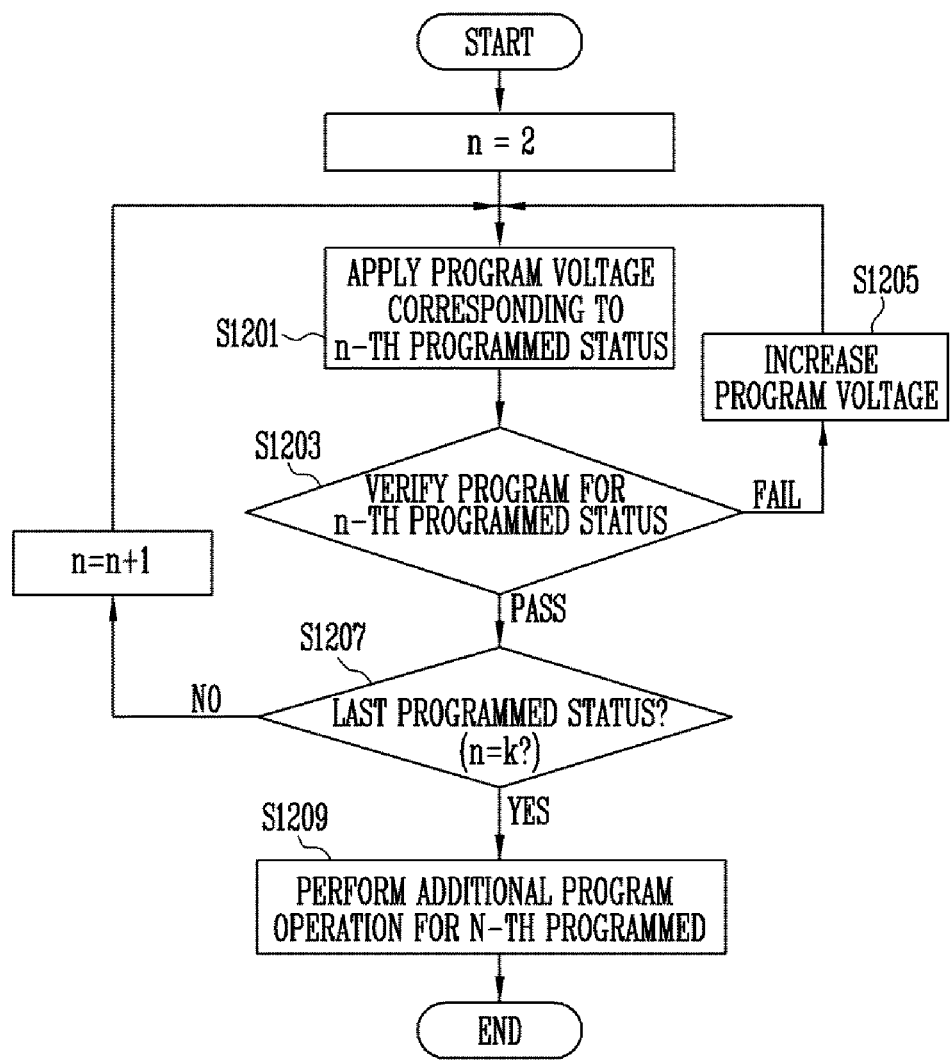
FIG. 12 is a flowchart illustrating a method of operating a memory device, in accordance with an embodiment of the present disclosure.

FIG. 12 is a flowchart illustrating a method of operating a memory device in accordance with an embodiment of the present disclosure.

Referring to FIG. 12, the memory device may perform a program operation such that each selected memory cell has a threshold voltage corresponding to any one of first to k-th programmed statuses. Here, the first programmed status may be an erased status. Furthermore, k is a natural number equal to or greater than n. The threshold voltage of the memory cell corresponds to an erased status before a program operation is performed. Therefore, in the case where n is 2, the program operation may start from memory cells having a second programmed status as a target programmed status.

Steps S1201 to S1205 may be performed in the same manner as those of steps S1001 to S1005 described with reference to FIG. 10.

At step S1207, the memory device 100 may determine whether the n-th programmed status corresponds to a last programmed status having the highest threshold voltage among the plurality of programmed statuses. If a result of the determination indicates that the n-th programmed status corresponds to the k-th programmed status that is the highest programmed status, the process proceeds to step S1209. In contrast, if n is less than k, the process returns to step S1201, and a program operation may be performed for a subsequent programmed status.

At step S1209, the memory device may perform an additional program operation for the n-th programmed status.

The additional program operation may be performed in the same manner as that of step S1007 described with reference to FIG. 10.

According to the embodiment of FIG. 12, the additional program operation is performed only for the highest programmed status. Typically, the degree to which the threshold voltage reduces due to the retention effect is increased as the threshold voltage of the programmed status to which the memory cell has been programmed is increased. Therefore, compared to the embodiment of FIG. 10, in the embodiment of FIG. 12, because the additional program operation is performed only for the highest programmed status, the time it takes to perform the program operation may be prevented from excessively increasing due to the additional program operation.

Figure 13:
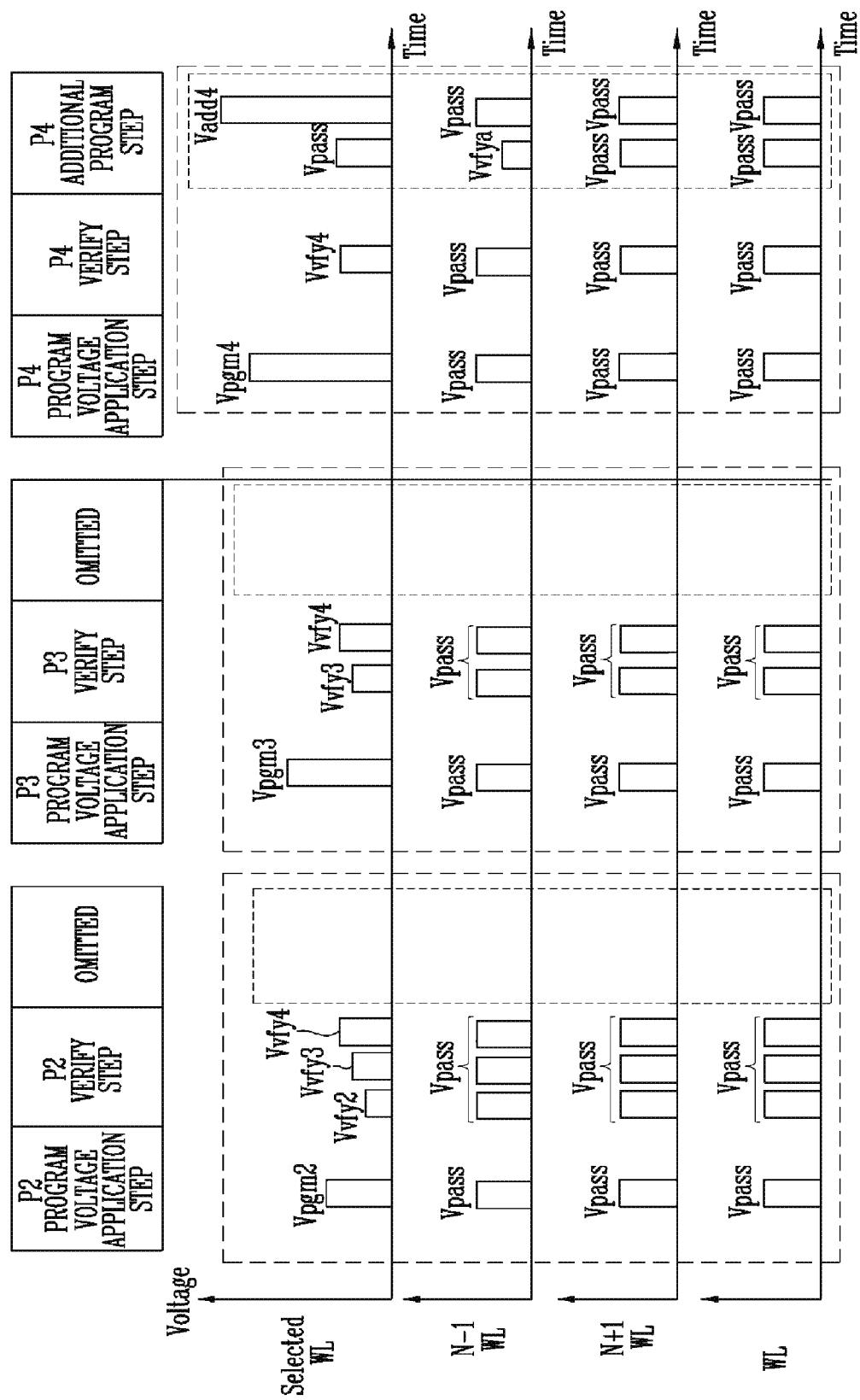
FIG. 13 is a diagram illustrating voltages applied to respective word lines during a program operation, in accordance with an embodiment of FIG. 12.

FIG. 13 is a diagram for describing voltages to be applied to respective word lines during a program operation in accordance with an embodiment of FIG. 12.

Referring to FIG. 13, additional program operations corresponding to a P2 programmed status and a P3 programmed status may be omitted. Only an additional program operation for a P4 programmed status that is the highest programmed status might be performed.

Program operations corresponding to the P2 programmed status and the P3 programmed status of FIG. 13, except that the additional program operations corresponding to the P2 programmed status and the P3 programmed status are omitted, may be performed in the same manner as the program operations corresponding to the P2 programmed status and the P3 programmed status of FIG. 11.

Figure 14:
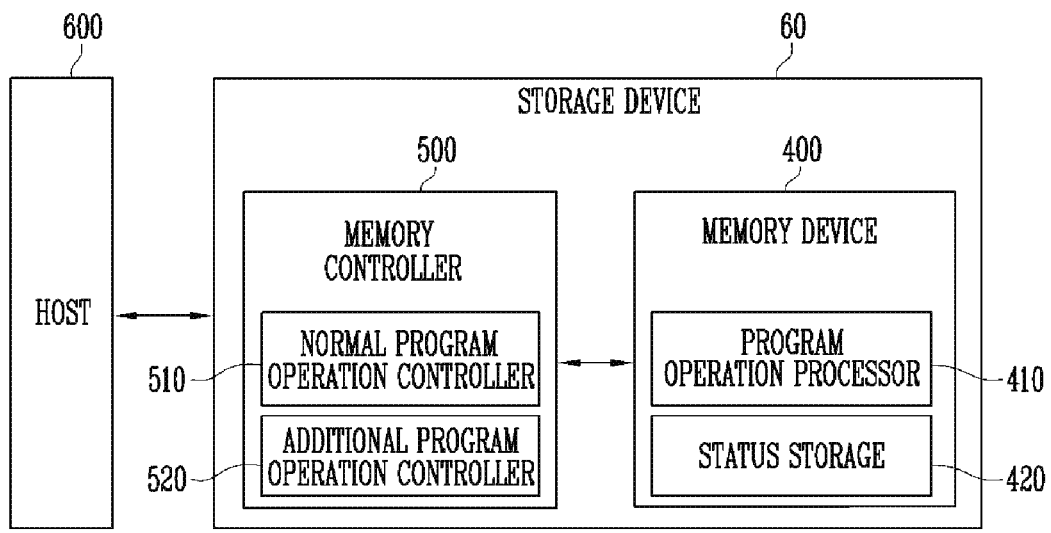
FIG. 14 is a diagram illustrating a structure of a storage device, in accordance with an embodiment of the present disclosure.

FIG. 14 is a diagram illustrating the structure of a storage device 60 in accordance with an embodiment of the present disclosure.

Referring to FIG. 14, the storage device 60 may include a memory device 400 and a memory controller 500 configured to control the operation of the memory device 400.

The configuration of the memory device 400 may be the same as that of the memory device 100 described with reference to FIG. 2, other than including the additional program operation controller 131.

The memory device 400 may include a program operation processor 410 and status storage 420.

The program operation processor 410 may perform a normal program operation in response to a normal program command received from the memory controller 500. In an embodiment, the program operation processor 410 may perform an additional program operation in response to an additional program command received from the memory controller 500.

The status storage 420 may store normal program completion information that is information related to the normal program operation after the memory device 400 has performed the normal program operation. The status storage 420 may provide the normal program completion information stored therein to the memory controller 500, in response to a request from the memory controller 500.

The memory controller 500 may have the same configuration and operation as those of the memory controller 200 described with reference to FIG. 1.

In accordance with an embodiment of FIG. 14, the memory controller 500 may further include a normal program operation controller 510 and an additional program operation controller 520.

The normal program operation controller 510 may provide a normal program command to the memory device 400, and obtain, if a related normal program is completed, normal program complete information from the memory device 400. The normal program operation controller 510 may provide the normal program complete information to the additional program operation controller 520.

The additional program operation controller 520 may control the additional program operation of the memory device 400. The additional program operation controller 520 may detect erased cells each having a threshold voltage corresponding to an erased status among memory cells coupled to an adjacent word line that has been previously programmed among word lines adjacent to a selected word line on which the normal program operation has been performed. The additional program operation controller 520 may determine that memory cells to which erased cells are adjacent among the memory cells on which the normal program operation has been performed are additional program cells. The additional program operation controller 520 may determine the level of an additional program voltage based on the normal program complete information. The additional program operation controller 520 may provide, to the memory device 400, an additional program command for instructing to apply additional program voltages to additional program cells.

Figure 15:
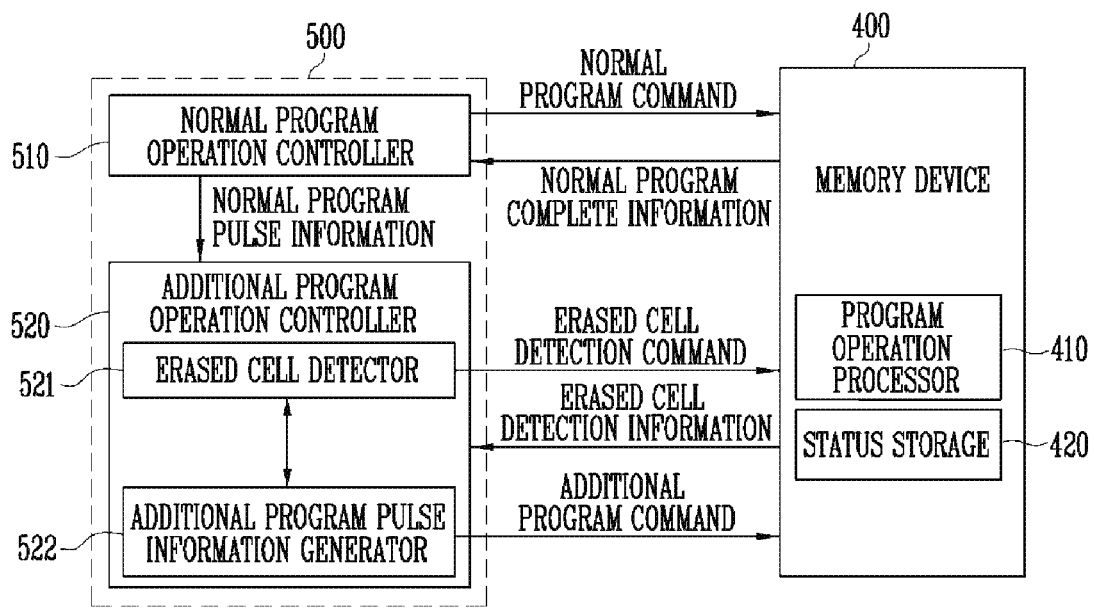
FIG. 15 is a diagram illustrating a structure of a memory controller of FIG. 14.

FIG. 15 is a diagram illustrating in detail the structure of the memory controller 500 of FIG. 14.

Referring to FIG. 15, the normal program operation controller 510 may provide a normal program command to the memory device 400. In response to the provided normal program command, the memory device 400 may perform a normal program operation. The normal program operation may be an operation of storing data provided from the memory controller 500 in memory cells.

If the normal program operation is completed, the memory device 400 may store normal program complete information in the status storage 420. The normal program operation controller 510 may obtain the normal program complete information stored in the status storage 420. The normal program operation controller 510 may provide the normal program complete information to the additional program operation controller 520.

The additional program operation controller 520 may further include an erased cell detector 521 and an additional program pulse information generator 522.

The erased cell detector 521 may determine whether the normal program operation has been completed based on operation fail information included in the normal program complete information. The erased cell detector 521 may provide an erased cell detection command to an adjacent word line on which a program operation has been previously performed among word lines adjacent to a selected word line on which the normal program operation has been performed. In an embodiment, the erased cell detection command may be a read command for instructing to read memory cells each having an erased status. In response to the erased cell detection command, the memory device 400 may provide, to the erased cell detector 521, erased cell detection information including a result of reading the memory cells coupled to the adjacent word line on which the program operation has been previously performed among the word lines adjacent to the selected word line on which the normal program operation has been performed.

Based on the ease cell detection information, the erased cell detector 521 may determine additional program cells that are memory cells, to which erased cells are adjacent, and on which the additional program operation is to be performed, among the memory cells coupled to the selected word line on which the normal program operation has been performed. The erased cell detector 521 may provide information about the additional program cells to the additional program pulse information generator 522.

The additional program pulse information generator 522 may determine the level of the additional program voltage based on operation status information included in the normal program complete information. In detail, the operation status information included in the normal program complete information may include information about the level of a last applied program voltage and the level of a step voltage. Alternatively, the operation status information may include information about the level of a program start voltage, the number of program loops performed during the normal program operation, and the level of the step voltage. The program voltage may increase by the step voltage each time a program loop is performed. Therefore, if a program start voltage and the number of performed program loops are checked, the level of the last applied program voltage may be determined. The additional program pulse information generator 522 may determine that a voltage higher by the step voltage than the level of the last applied program voltage is an additional program voltage.

The additional program pulse information generator 522 may provide, to the memory device 400, an additional program command for instructing to apply a voltage corresponding to the additional program voltage to the additional program cells.

Figure 16:
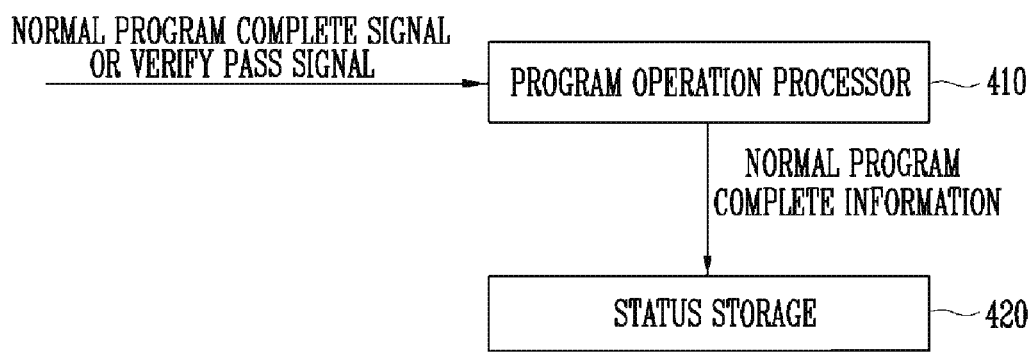
FIG. 16 is a diagram illustrating an operation of a memory device, in accordance with an embodiment of FIG. 14.

FIG. 16 is a diagram illustrating an operation of the memory device 400 in accordance with an embodiment of FIG. 14.

Referring to FIG. 16, the memory device 400 may perform a normal program operation in response to a normal program command received from the memory controller 500. The normal program operation may be an operation corresponding to S1001 to S1003 described with reference to FIG. 10. Alternatively, the normal program operation may be an operation corresponding to S1201 to S1203 described with reference to FIG. 12.

The program operation processor 410 may store normal program complete information in the status storage 420, in response to a normal program complete signal that is a control signal indicating that the normal program operation has been completed, or a verify pass signal that is a control signal indicating that a verification has passed during the normal program operation.

Figure 17:
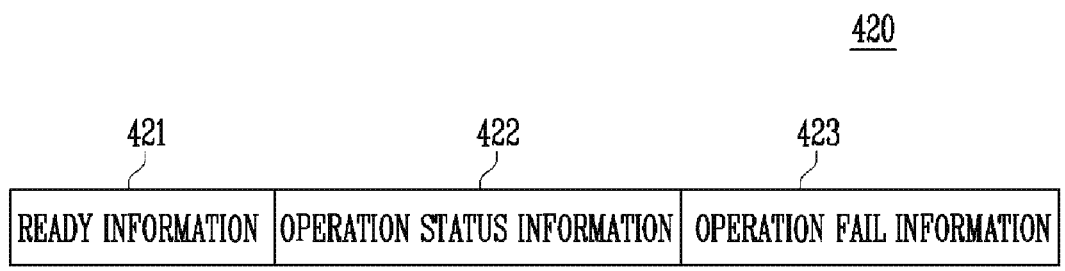
FIG. 17 is a diagram illustrating a status storage of FIG. 16.

FIG. 17 is a diagram illustrating the status storage 420 of FIG. 16.

Referring to FIG. 17, the status storage 420 may receive normal program complete information from the program operation processor 410.

The normal program complete information may include ready information 421, operation status information 422, and operation fail information 423.

The ready information 421 may be information indicating whether the memory device 400 is in a ready status.

The operation status information 422 may include information about program voltages applied to the memory cells during a normal program operation. In detail, the operation status information may include information about the level of a last applied program voltage and the level of a step voltage. Alternatively, the operation condition information may include information about the level of a program start voltage, the number of program loops performed during the normal program operation, and the level of the step voltage.

The operation fail information 423 may be information indicating whether the normal program operation has failed.

Figure 18:
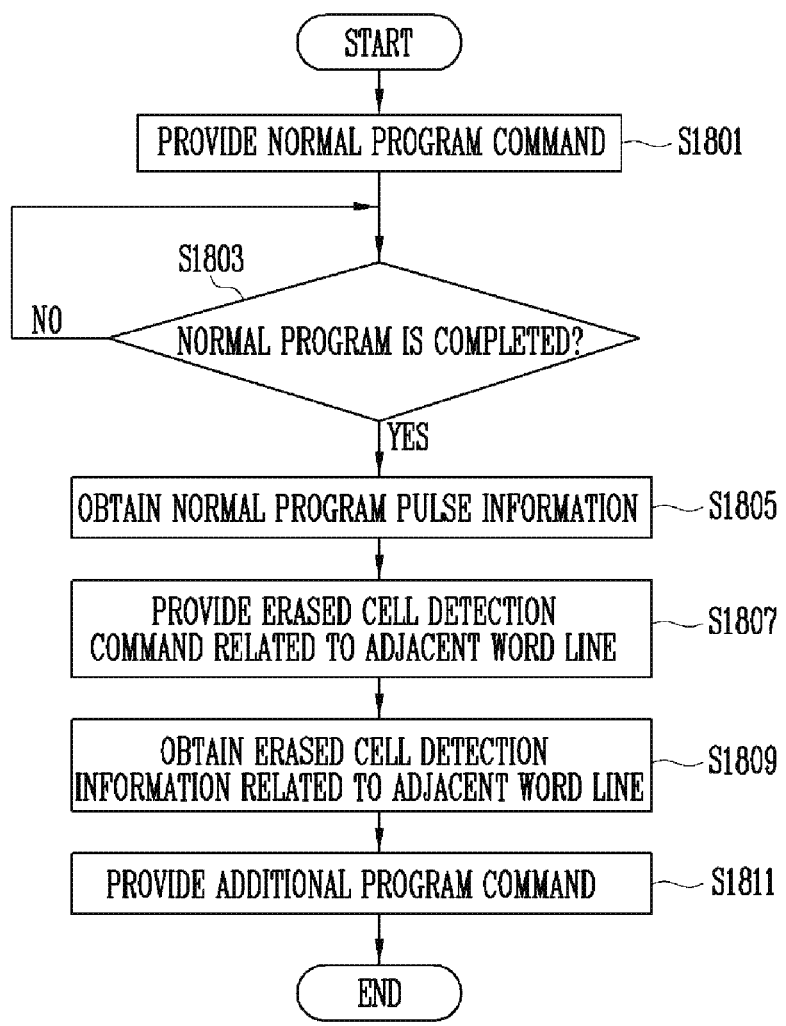
FIG. 18 is a flowchart illustrating an operation of a memory controller, in accordance with an embodiment of FIG. 14.

FIG. 18 is a flowchart illustrating an operation of the memory controller 500 in accordance with an embodiment of FIG. 14.

Referring to FIG. 18, at step S1801, the memory controller 500 may provide a normal program command to the memory device 400 to perform a normal program operation.

At step S1803, the memory controller 500 may determine whether the normal program operation has been completed.

At step S1805, the memory controller 500 may obtain normal program pulse information from the memory device 400.

At step S1807, the memory controller 500 may provide an erased cell detection command to the memory device 400 to detect whether the threshold voltage of a memory cell coupled to a word line adjacent to a selected word line corresponds to an erased status.

At step S1809, the memory controller 500 may obtain, from the memory device 400, erased cell detection information about whether the threshold voltage of the memory cell coupled to the word line adjacent to the selected word line corresponds to the erased status.

At step S1811, the memory controller 500 may provide an additional program command to the memory device 400 to perform an additional program operation.

Figure 19:
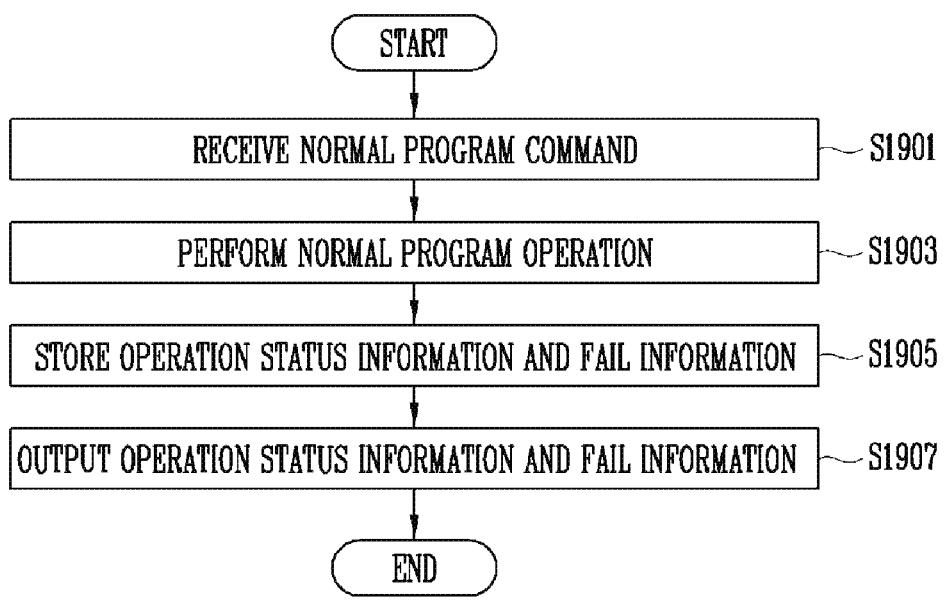
FIG. 19 is a flowchart illustrating an operation of a memory controller, in accordance with an embodiment of FIG. 14.

FIG. 19 is a flowchart illustrating an operation of the memory controller 500 in accordance with an embodiment of FIG. 14.

Referring to FIG. 19, at step S1901, the memory device 400 may receive, from the memory controller 500, a normal program command for a selected memory cell.

At step 1903, the memory device 400 may perform a normal program operation on the selected memory cell in response to the normal program command.

At step S1905, the memory device 400 may store, in the status storage, operation status information and fail information about the normal program operation.

At step S1907, the memory device 400 may output, to the memory controller 500, the operation status information and the fail information stored in the status storage.

Figure 20:
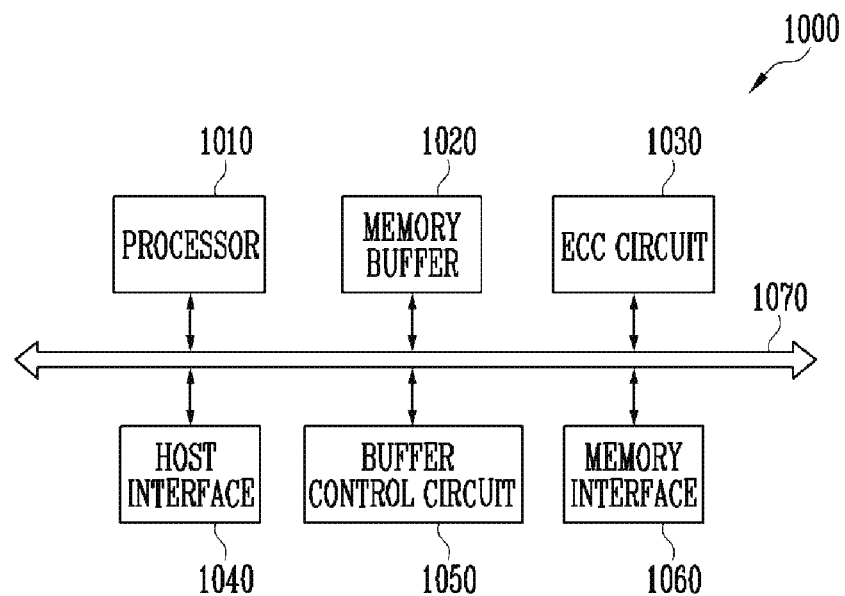
FIG. 20 is a diagram illustrating an embodiment of a memory controller of FIG. 1.

FIG. 20 is a diagram illustrating an embodiment of a memory controller 1000, which, for an embodiment, may represent the memory controller 200 of FIG. 1.

Referring to FIG. 20, a memory controller 1000 is coupled to a host and a memory device. In response to a request from the host, the memory controller 1000 may access the memory device. The memory controller 1000 may provide an interface between the memory device and the host. The memory controller 1000 may drive firmware for controlling the memory device.

The memory controller 1000 may include a processor 1010, a memory buffer 1020, an error correction code (ECC) circuit 1030, a host Interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040, and communicate with the memory device through the memory interface 1060. In addition, the processor 1010 may communicate with the memory buffer 1020 through the buffer control circuit 1050. The processor 1010 may control the operation of the storage device using the memory buffer 1020 as an operating memory, a cache memory, or a buffer memory.

The processor 1010 may perform the function of a flash translation layer (FTL). The processor 1010 may translate a logical address (LA), provided by the host, into a physical address (PA) through the FTL. The FTL may receive the LA using a mapping table and translate the LA into the PA. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device as data to be stored, and may be programmed to the memory cell array.

During a read operation, the processor 1010 may derandomize data received from the memory device. For example, the processor 1010 may use a derandomizing seed to derandomize data received from the memory device. Derandomized data may be output to the host.

In an embodiment, the processor 1010 may drive software or firmware to perform the randomizing operation or the derandomizing operation.

The memory buffer 1020 may be used as an operating memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM) communication methods.

The buffer control circuit 1050 may control the memory buffer 1020 under control of the processor 1010.

The memory interface 1060 may communicate with the memory device 100 under control of the processor 1010. The memory interface 1060 may communicate a command, an address, and data with the memory device through the channel.

For example, the memory controller 1000 may include neither the memory buffer 1020 nor the buffer control circuit 1050.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

In an embodiment, the operation of the normal program operation controller 510 and the additional program operation controller 520 described with reference to FIG. 15 may be performed by the processor 1010.

Figure 21:
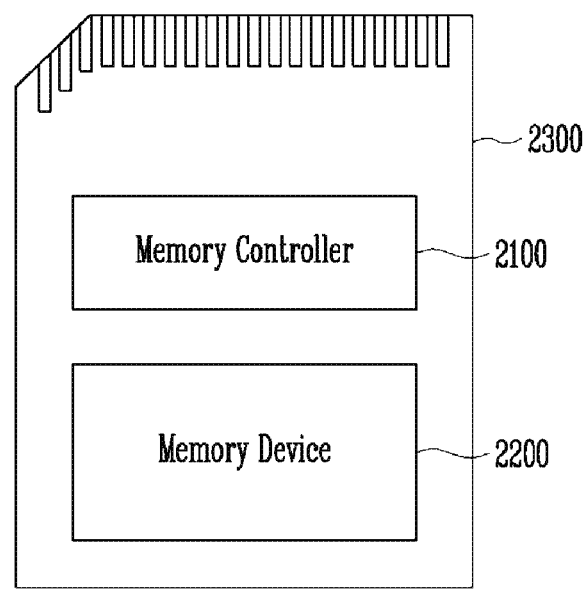
FIG. 21 is a block diagram illustrating a memory card system to which a storage device in accordance with an embodiment of the present disclosure is applied.

FIG. 21 is a block diagram illustrating a memory card system 2000 to which a storage device in accordance with an embodiment of the present disclosure is applied.

Referring FIG. 21, the memory card system 2000 may include a memory controller 2100, a memory device 2200, and a connector 2300.

The memory controller 2100 is coupled to the memory device 2200. The memory controller 2100 may access the memory device 2200. The memory controller 2100 may be embodied in the same manner as that of the memory controller 200 described with reference to FIG. 1.

In an embodiment, the memory controller 2100 may include components such as a random access memory (RAM), a processing unit, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory controller 2100 and the memory device 2200 may be integrated into a single semiconductor device to form a memory card. For example, the memory controller 2100 and the memory device 2200 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The memory controller 2100 of FIG. 21 may represent the memory controller 200 described with reference to FIG. 1 or the memory controller 500 described with reference to FIG. 14. Furthermore, the memory device 2200 may correspond to either the memory device 100 described with reference to FIG. 1 or the memory device 400 described with reference to FIG. 14.

Figure 22:
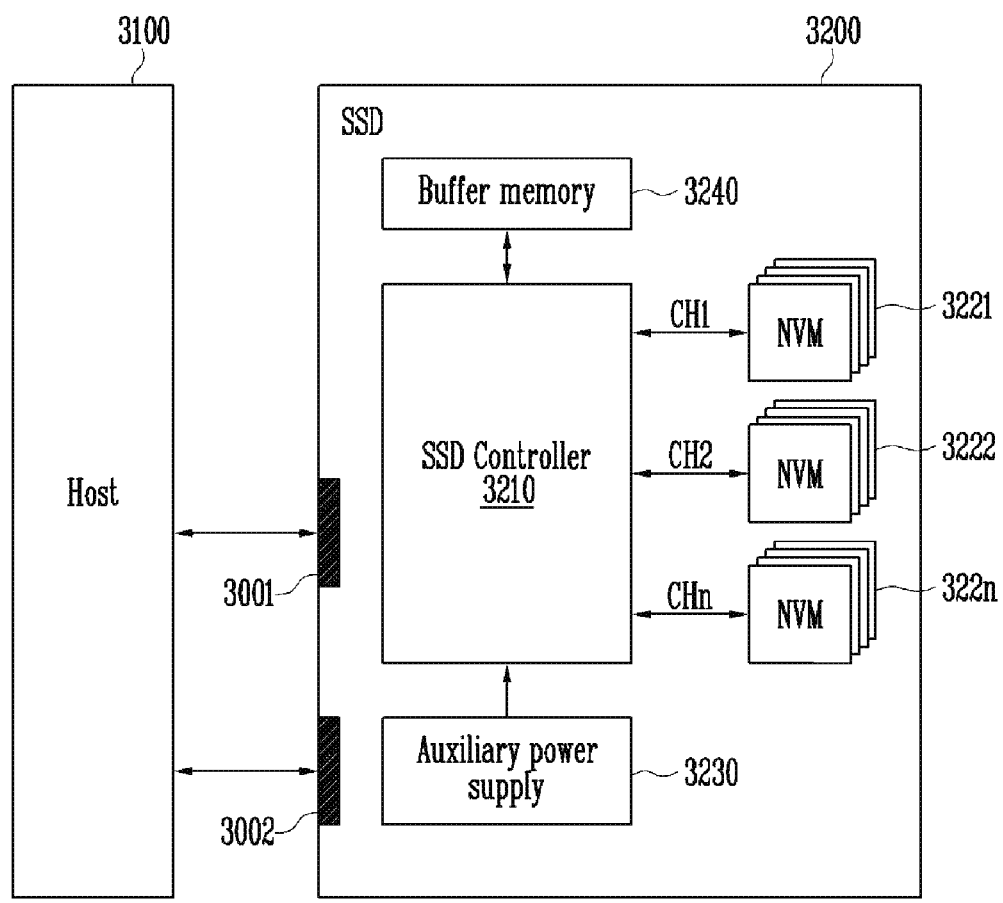
FIG. 22 is a block diagram illustrating a user system to which a storage device in accordance with an embodiment of the present disclosure is applied.

FIG. 22 is a block diagram illustrating a solid state drive (SSD) system 3000 to which a storage device in accordance with an embodiment of the present disclosure is applied.

Referring to FIG. 22, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be signals based on an interface between the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as an FRAM, a ReRAM, an STT-MRAM, and a PRAM.

Figure 23:
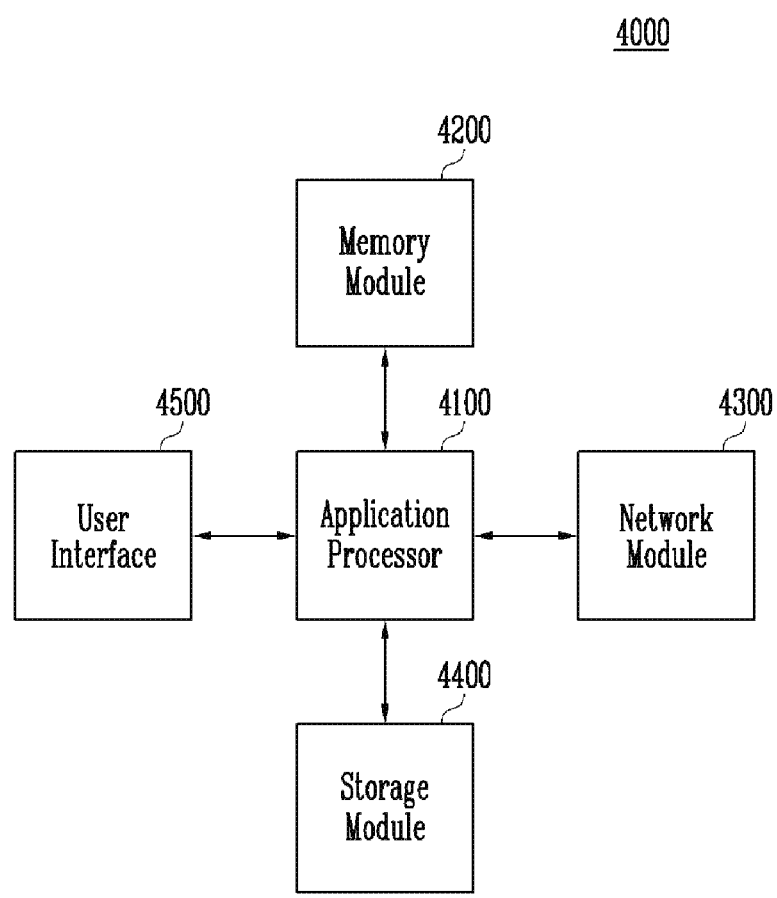
FIG. 23 is a block diagram illustrating a solid state drive (SSD) system to which a storage device in accordance with an embodiment of the present disclosure is applied.

FIG. 23 is a block diagram illustrating a user system 4000 to which a storage device in accordance with an embodiment of the present disclosure is applied.

Referring to FIG. 23, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be operated in the same manner as that of the memory device 100 described above with reference to FIG. 1. The storage module 4400 may be operated in the same manner as that of the storage device 50, described above with reference to FIG. 1.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as an a liquid crystal display (LCD), an organic light emitting diode (OLED) display device, an active matrix OLED (AMOLED) display device, an LED, a speaker, and a motor.

As described above, various embodiments of the present disclosure may provide a storage device having improved reliability, and a method of operating the storage device.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a memory device configured to perform a program operation on a first memory cell coupled to a selected word line, the method comprising:
   determining, after the program operation on the first memory cell has been performed, whether a threshold voltage of a second memory cell coupled to a same bit line to which the first memory cell is coupled to a word line adjacent to the selected word line corresponds to an erased status; and
   applying to the first memory cell, when the threshold voltage of the second memory cell corresponds to the erased status, an additional program voltage higher by a preset voltage than a program voltage last applied during the program operation.

2. The method according to claim 1, wherein the program operation is performed on the second memory cell before the program operation is performed on the first memory cell.

3. The method according to claim 1, wherein the additional program voltage applied to the first memory cell is based on a program start voltage of the program voltage last applied during the program operation, a step voltage, and a program pulse count.

4. The method according to claim 1, wherein programming the first memory cell comprises programming the first memory cell to any one of a plurality of programmed statuses except the erased status.

5. The method according to claim 1, wherein determining whether the threshold voltage of the second memory cell corresponds to the erased status comprises:
   applying an additional verify voltage to the adjacent word line; and
   applying a pass voltage higher than the additional verify voltage to word lines other than the adjacent word line.

6. The method according to claim 3, wherein applying the additional program voltage to the first memory cell comprises applying a program enable voltage to the same bit line while the additional program voltage is applied to the selected word line.

7. The method according to claim 1, wherein applying the additional program voltage to the first memory cell comprises:
   determining whether the program operation is a program operation corresponding to a programmed status having a highest threshold voltage among a plurality of programmed statuses; and
   applying the additional program voltage when the program operation is determined to be the program operation corresponding to the highest programmed status.

8. A memory device comprising:
   a memory cell array including a first memory cell coupled to a selected word line;
   a peripheral circuit configured to perform a program operation on the first memory cell; and
   control logic configured to control the peripheral circuit, after the program operation has been performed, if a threshold voltage of a second memory cell coupled to a same bit line to which the first memory cell is coupled and coupled to a word line adjacent to the selected word line corresponds to an erased status, to apply an additional program voltage higher by a preset voltage than a program voltage last applied during the program operation to the first memory cell.

9. The memory device according to claim 8, wherein the program operation is performed in an incremental step pulse program (ISPP) manner.

10. The memory device according to claim 8, wherein the control logic is configured to operate the additional program voltage based on a program start voltage of the program voltage last applied during the program operation, a step voltage, and a program pulse count.

11. The memory device according to claim 8, wherein the first memory cell is programmed to any one of a plurality of programmed statuses except the erased status.

12. The memory device according to claim 8, wherein the program operation is performed on the second memory cell before the program operation is performed on the first memory cell.

13. The memory device according to claim 8, wherein the control logic is configured to apply a program enable voltage to the same bit line while the additional program voltage is applied to the first memory cell.

14. The memory device according to claim 8, wherein the control logic is configured to apply the additional program voltage to the first memory cell when the first memory cell is programmed to a programmed status corresponding to a highest threshold voltage among a plurality of programmed statuses separated from each other based on a threshold voltage of a memory cell.

15. A memory controller configured to control a memory device, the memory controller comprising:
- a normal program operation controller included in the memory device and configured to provide a normal program command for performing a normal program operation on a first memory cell coupled to a selected word line, and configured to obtain, when the normal program operation is completed, normal program complete information comprising information about the normal program operation; and
- an additional program operation controller configured to determine, based on the normal program complete information, additional program cells that are memory cells on which an additional program operation is to be performed when a threshold voltage of a second memory cell coupled to a same bit line to which the first memory cell is coupled corresponds to an erased status, and provide an additional program command for performing an additional program operation on the additional program cells.

16. The memory controller according to claim 15, wherein the additional program operation controller comprises:
- an erased cell detector configured to detect the additional program cells; and
- an additional program pulse information generator configured to determine a level of an additional program voltage to be used during the additional program operation based on the normal program complete information.

17. The memory controller according to claim 15, wherein the normal program complete information includes information about a step voltage and a level of a program voltage last applied during the normal program operation.

* * * * *